US012777827B2

(12) United States Patent
Kang et al.

(10) Patent No.: US 12,777,827 B2
(45) Date of Patent: Oct. 27, 2026

(54) ELECTROLUMINESCENT DISPLAY DEVICE CAPABLE OF REDUCING ELECTROMAGNETIC INTERFERENCE

(71) Applicant: LG Display Co., Ltd., Seoul (KR)

(72) Inventors: MinJoo Kang, Paju-si (KR); SeongJun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 422 days.

(21) Appl. No.: 18/236,470

(22) Filed: Aug. 22, 2023

(65) Prior Publication Data

US 2024/0130208 A1 Apr. 18, 2024

(30) Foreign Application Priority Data

Oct. 17, 2022 (KR) ........................ 10-2022-0133131

(51) Int. Cl.
*H10K 59/80* (2023.01)

(52) U.S. Cl.
CPC ..... *H10K 59/8794* (2023.02); *H10K 59/8722* (2023.02); *H10K 59/873* (2023.02)

(58) Field of Classification Search
CPC ........... H10K 59/8794; H10K 59/8722; H10K 59/873; H10K 59/12; H10K 50/10
See application file for complete search history.

(56) References Cited

U.S. PATENT DOCUMENTS

2011/0297996 A1 12/2011 van den Brand et al.
2012/0181929 A1 7/2012 Ha
2015/0185942 A1 7/2015 Kim et al.
2015/0303219 A1* 10/2015 Tada .................... H10D 86/60 257/386
2016/0351641 A1 12/2016 Ito et al.
2019/0204952 A1* 7/2019 Han ..................... H10K 59/40
2021/0173248 A1 6/2021 Lee et al.
(Continued)

FOREIGN PATENT DOCUMENTS

KR 10-2011-0035145 A 4/2011
KR 10-2014-0096635 A 8/2014
(Continued)

OTHER PUBLICATIONS

German Office Action dated Apr. 10, 2024 issued in Patent Application No. 10 2023 125 934.2 w/English Translation (9 pages).
(Continued)

*Primary Examiner* — Tracie Y Green
(74) *Attorney, Agent, or Firm* — PnK IP LLC

(57) ABSTRACT

An electroluminescent display device includes a display part configured to display an image. Also, the electroluminescent display device includes an encapsulation unit disposed over the display part and a heat dissipation sheet disposed over the encapsulation unit. The encapsulation unit includes a sealing member composed of a first adhesive layer, a second adhesive layer, and a barrier layer between the first adhesive layer and the second adhesive layer. Further, the encapsulation unit includes a hole in the second adhesive layer and the barrier layer. A side surface of the barrier layer may be electrically connected to the heat dissipation sheet through a conductive paste injected into the hole. Thus, it is possible to improve electromagnetic interference.

19 Claims, 17 Drawing Sheets

(56) References Cited

U.S. PATENT DOCUMENTS

| | | | | |
|---|---|---|---|---|
| 2021/0210728 | A1 | 7/2021 | Eom et al. | |
| 2021/0335770 | A1* | 10/2021 | Morino .............. | H10K 59/8794 |
| 2022/0109124 | A1 | 4/2022 | Kang et al. | |

FOREIGN PATENT DOCUMENTS

| | | | |
|---|---|---|---|
| KR | 10-2015-0075688 | A | 7/2015 |
| KR | 10-2016-0059818 | A | 5/2016 |
| KR | 10-2016-0140405 | A | 12/2016 |
| KR | 10-2017-0050365 | A | 5/2017 |
| KR | 10-2019-0023864 | A | 3/2019 |
| KR | 10-2019-0061443 | A | 6/2019 |
| KR | 10-2019-0114383 | A | 10/2019 |
| KR | 10-2021-0073151 | A | 6/2021 |
| KR | 10-2021-0081953 | A | 7/2021 |
| KR | 10-2022-0045410 | A | 4/2022 |
| TW | 202230776 | A | 8/2022 |
| WO | 2011/040441 | A1 | 4/2011 |

OTHER PUBLICATIONS

Search Report from the UKIPO dated Feb. 8, 2024 issued in Patent Application No. GB2312089.2 (5 pages).

* cited by examiner

ELECTROLUMINESCENT DISPLAY DEVICE CAPABLE OF REDUCING ELECTROMAGNETIC INTERFERENCE

CROSS-REFERENCE TO RELATED APPLICATION

This application claims the priority of Korean Patent Application No. 10-2022-0133131 filed on Oct. 17, 2022, which is hereby incorporated by reference in its entirety.

BACKGROUND

Field of the Disclosure

The present disclosure relates to an electroluminescent display device, and more particularly, to an electroluminescent display device capable of reducing electromagnetic interference (EMI) and/or dissipating heat.

Description of the Background

As the information age enters, the field of display devices for visually displaying electrical information signals is rapidly developing. Thus, studies for developing performances such as thinning, weight reduction, and low power consumption have continued.

Representative examples of the display devices include a liquid crystal display (LCD) device, an electro-wetting display (EWD) device, an organic light emitting display (OLED) device, and the like.

An electroluminescent display device including the OLED device is a self-emitting display device and does not require a separate light source unlike the LCD device. Thus, the electroluminescent display device may be manufactured in a lightweight and thin form. Further, the electroluminescent display device is not only advantageous in terms of power consumption by low voltage driving, but also has excellent color expression ability, response speed, viewing angle and contrast ratio (CR). Therefore, the electroluminescent display device is expected to be utilized in various fields.

SUMMARY

Accordingly, the present disclosure is directed to an electroluminescent display device that substantially obviates one or more of problems due to limitations and disadvantages described above.

More specifically, the present disclosure is to provide an electroluminescent display device with increased rigidity of a display panel and improved heat dissipation.

In addition, the present disclosure is to provide an electroluminescent display device capable of reducing electromagnetic interference (EMI).

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, an electroluminescent display device includes a display part configured to display an image. Also, the electroluminescent display device includes an encapsulation unit disposed over the display part and a heat dissipation sheet disposed over the encapsulation unit. The encapsulation unit includes a sealing member composed of a first adhesive layer, a second adhesive layer, and a barrier layer between the first adhesive layer and the second adhesive layer. A hole is formed in the second adhesive layer and the barrier layer. A side surface of the barrier layer may be electrically connected to the heat dissipation sheet through a conductive paste injected into the hole.

According to the present disclosure, an encapsulation structure has a multilayer structure including a relatively thick reinforcing substrate. Thus, it is possible to achieve sufficient rigidity and heat dissipation.

According to the present disclosure, a conductive paste is injected through a hole penetrating the reinforcing substrate to achieve electrical connection to a barrier layer of a sealing member. Other means of providing this electrical connection are possible. Therefore, according to the present disclosure there is provided a conductive member passing through or penetrating the reinforcing substrate to provide an electrical connection to a barrier layer of a sealing member. Thus, it is possible to reduce EMI. In addition, the barrier layer may be provided over the light emitting structures of the display. The light emitting structures may emit heat during operation. The barrier layer may assist conduction of the heat away from the area around the light emitting structures. The conductive member provided in the hole and connected to the barrier layer allows the heat to be conducted away from the barrier layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain principles of the disclosure.

In the drawings.

DETAILED DESCRIPTION

Figure 1:
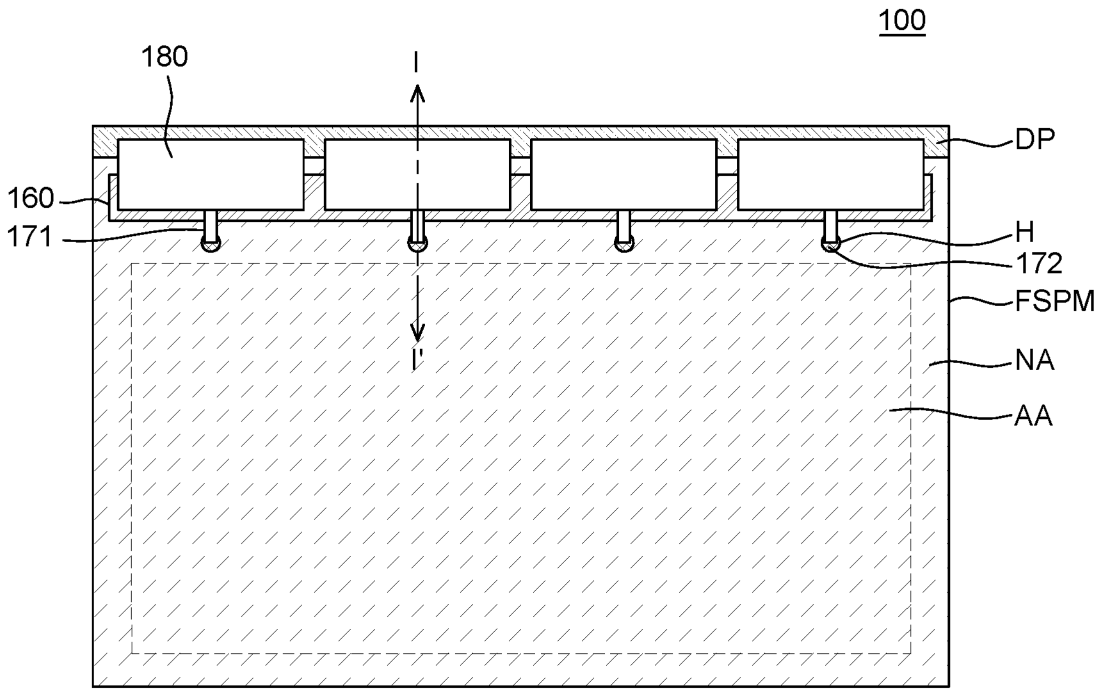
FIG. 1 is a plan view schematically illustrating an electroluminescent display device according to a first exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “consist of” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly”.

When an element or layer is disposed “on” another element or layer, another layer or another element may be interposed directly on the other element or therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

FIG. 1 is a plan view schematically illustrating an electroluminescent display device according to a first exemplary aspect of the present disclosure.

Referring to FIG. 1, an electroluminescent display device 100 according to a first exemplary aspect of the present disclosure may include a display part DP, an encapsulation unit FSPM, and a heat dissipator (described herein as a heat dissipation sheet 160, though the present disclosure is not limited to a heat dissipator formed as a sheet and other structures are envisaged). The electroluminescent display device 100 may further include a flexible film 180.

The display part DP is a panel for displaying an image to a user.

Although not shown in the drawings, a display element to display an image, a driving element to drive the display element, and a line to transmit various signals to the display element and the driving element may be included in the display part DP. The display element may be defined in different ways depending on the type of the display part DP. For example, if the display part DP is an organic light emitting display panel, the display element may be an organic light emitting diode which includes an anode, an organic layer, and a cathode. For example, if the display part DP is a liquid crystal display panel, the display element may be a liquid crystal display element.

Hereinafter, even though the display part DP will be described as an organic light emitting display panel, the display part DP of the present disclosure is not limited to the organic light emitting display panel.

The display part DP may include an active area AA and a non-active area NA.

The active area AA is an area where an image is displayed in the display part DP.

A plurality of sub-pixels forming a plurality of pixels and a circuit for driving the plurality of sub-pixels may be disposed in the active area AA. The plurality of sub-pixels is a minimum emissive unit of the active area AA, and a display element may be disposed on each of the plurality of sub-pixels. The plurality of sub-pixels may form a pixel. For example, an organic light emitting diode composed of an anode, an organic layer, and a cathode may be disposed on each of the plurality of sub-pixels. However, the present disclosure is not limited thereto. Also, the circuit for driving the plurality of sub-pixels may include a driving element and a line. For example, the circuit may be composed of a thin film transistor, a storage capacitor, a gate line, a data line, etc., but is not limited thereto.

The non-active area NA is an area where an image is not displayed.

Although FIG. 1 illustrates that the non-active area NA encloses the active area AA having a rectangular shape, the shape and arrangement of the active area AA and the non-active area NA are not limited to the example illustrated in FIG. 1.

That is, the active area AA and the non-active area NA may have shapes suitable for a design of an electronic device equipped with the electroluminescent display device 100. For example, the active area AA may have a pentagonal shape, a hexagonal shape, a circular shape, an oval shape, and the like.

In the non-active area NA, various lines and circuits for driving the organic light emitting diodes in the active area AA may be disposed. For example, a link line for transmitting a signal to the plurality of sub-pixels and the circuit in the active area AA, or a driver IC such as a gate driver IC or a data driver IC may be disposed in the non-active area NA. However, the present disclosure is not limited thereto.

Also, the electroluminescent display device 100 may include various additional components for generating various signals or driving the pixels in the active area AA. Here, the additional components for driving the pixels may include an inverter circuit, a multiplexer, an electro static discharge (ESD) circuit, and the like. The electroluminescent display device 100 may also include components associated with functions other than the function to drive the pixels. For example, the electroluminescent display device 100 may include additional components for providing a touch sensing function, a user authentication function (e.g., finger print scanning), a multi-level pressure sensing function, a tactile feedback function, etc. The above-described additional components may be located in the non-active area NA and/or on an external circuit connected to a connection interface.

The flexible film 180 may be a film in which various components are disposed on a base film having a malleability. Specifically, the flexible film 180 serves to supply a signal to the plurality of sub-pixels and the circuits of the active area AA, and may be electrically connected to the display part DP. The flexible film 180 may be disposed at one end of the display part DP to supply a power voltage or a data voltage to the plurality of sub-pixels and the circuits of the active area AA. The number of flexible films 180 may vary depending on the design and is not limited to the illustrated example.

Meanwhile, a driving IC, such as a gate driver IC or a data driver IC, may be disposed on the flexible film 180. The driving IC may be a component to process data for displaying an image and a driving signal for processing the data. The driving IC may be disposed in a chip on glass (COG), chip on film (COF), or tape carrier package (TCP) manner depending on a mounting method.

Further, although not shown in the drawings, a printed circuit board may be disposed at one end of the flexible film 180 and connected to the flexible film 180. That is, the printed circuit board may be a component to supply signals to the driving IC. Also, the printed circuit board may supply various signals, such as a driving signal or a data signal, to the driving IC. For example, a data driver to generate data signals may be mounted on the printed circuit board, and the generated data signals may be supplied to the sub-pixels and the circuits on the display part DP through the flexible film 180.

Meanwhile, the encapsulation unit FSPM may be disposed on the display part DP.

The encapsulation unit FSPM may be composed of a sealing member and a reinforcing substrate.

The heat dissipation sheet 160 may be disposed on the encapsulation unit FSPM. However, the present disclosure is not limited thereto.

According to the present disclosure, an encapsulation structure has a multilayer structure including a relatively thick reinforcing substrate. Thus, it is possible to achieve sufficient rigidity and heat dissipation. However, if a plastic polymer such as polyethylene terephthalate (PET) is used for the reinforcing substrate, it is difficult to suppress electromagnetic interference (EMI). According to a conventional method, a conductive tape is attached to surfaces of the heat dissipation sheet and the reinforcing substrate, and a cross-section of the sealing member is electrically connected to the conductive tape through silver dots. In this case, when the encapsulation unit is cut, the reinforcing substrate made of PET may flow down along a side surface of the sealing member and cover a side surface of a barrier layer made of aluminum (Al) foil. Thus, electrical connection between the silver dots and the barrier layer may not be made.

According to the present disclosure, a hole H is formed to penetrate the reinforcing substrate. A conductive member 172 is provided in the hole H to electrically or thermally connect the barrier layer of the sealing member and a heat dissipator (which may also have the ability to dissipate electrical current) e.g., via a conductive tape 171. The conductive tape may be alternatively described herein as a conductive film. Thus, it is possible to improve EMI. The conductive member 172 may be a conductive material (e.g., a conductive paste) injected through the hole H. The injection of conductive material through the hole is an efficient and reliable method of providing the conductive member which saves manufacturing time and cost without compromising reliable performance. The conductive member is not limited to a conductive paste and the method of manufacture is not limited to injection, however.

Hereinafter, the encapsulation unit FSPM and a ground structure of the present disclosure will be described in detail with reference to FIG. 2 through FIG. 5.

Figure 2:
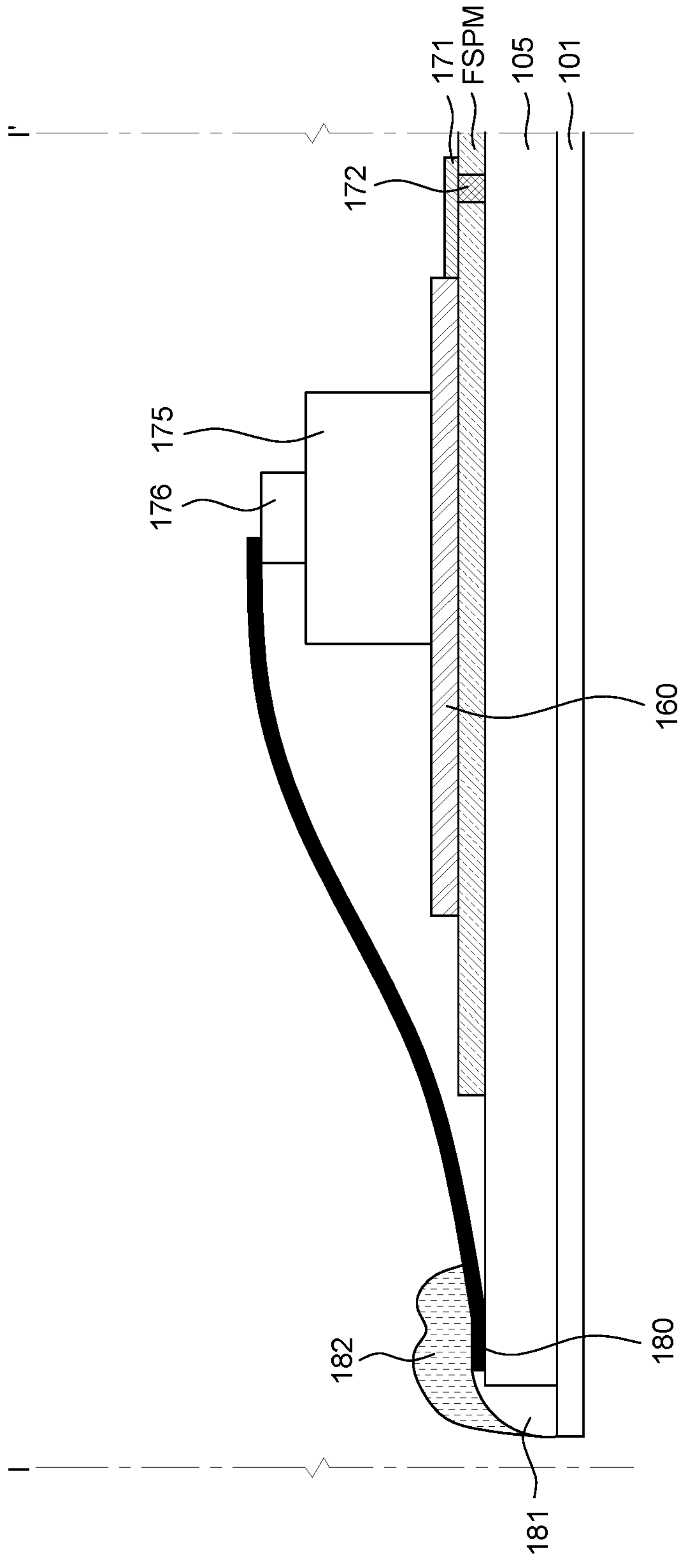
FIG. 2 is a cross-sectional view as taken along line I-I' of FIG. 1.

FIG. 2 is a cross-sectional view as taken along line I-I' of FIG. 1.

Figure 3:
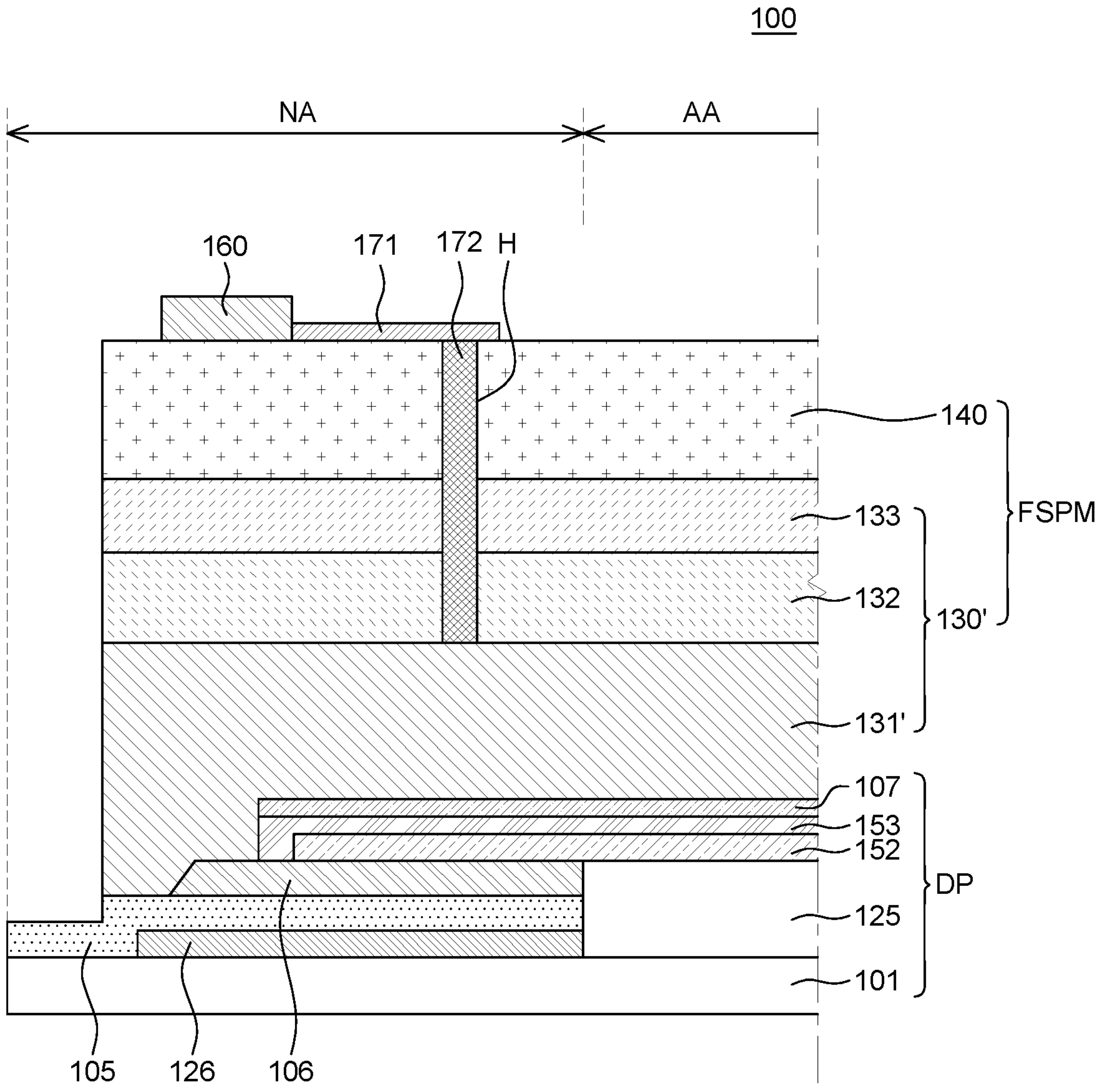
FIG. 3 is a cross-sectional view illustrating the laminated structure of FIG. 2 in more detail.

FIG. 3 is a cross-sectional view illustrating the laminated structure of FIG. 2 in more detail.

Figure 4:
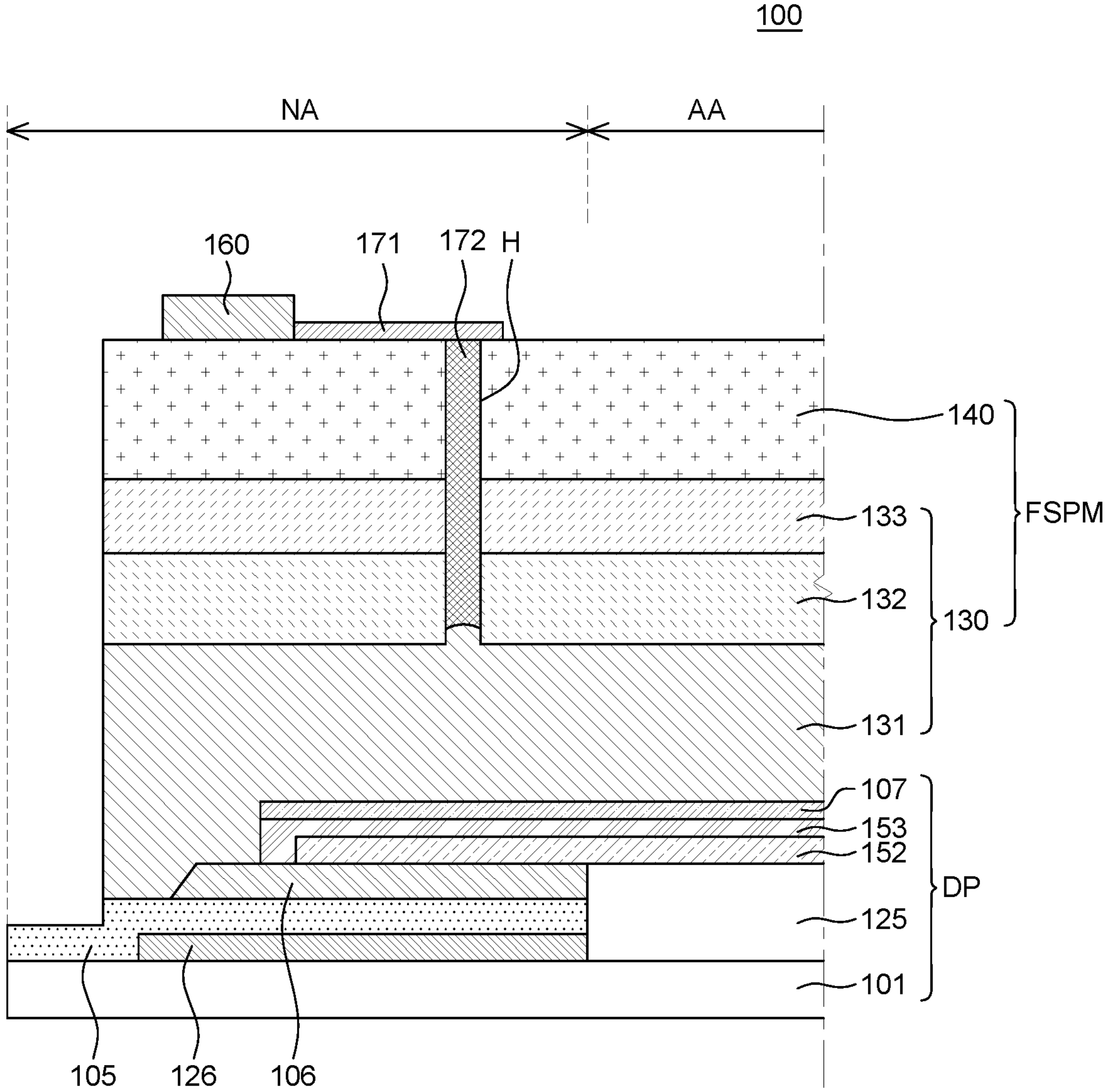
FIG. 4 is another cross-sectional view illustrating the laminated structure of FIG. 2 in more detail.

FIG. 4 is another cross-sectional view illustrating the laminated structure of FIG. 2 in more detail.

Figure 5:
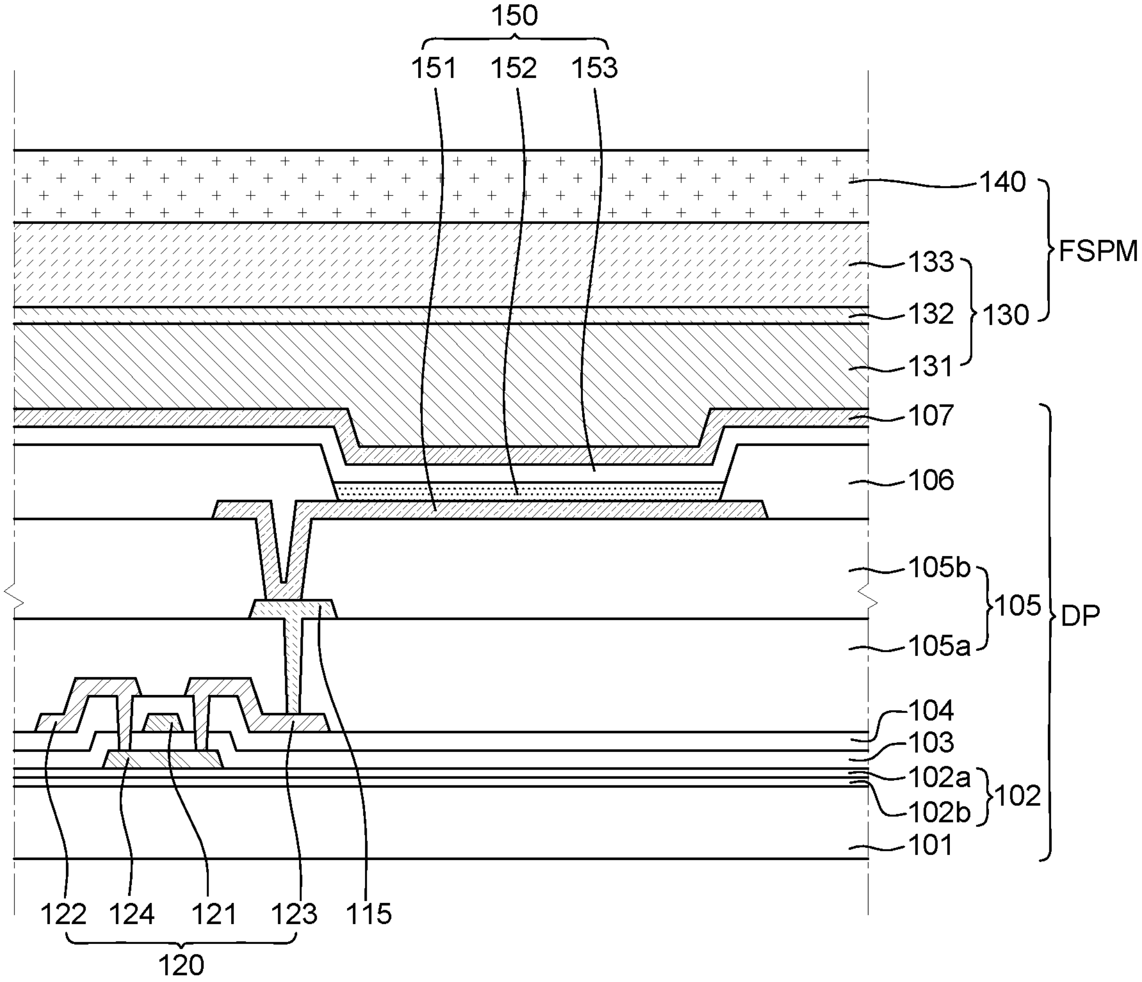
FIG. 5 is a cross-sectional view showing a sub-pixel of the electroluminescent display device according to the first exemplary aspect of the present disclosure.

FIG. 5 is a cross-sectional view showing a sub-pixel of the electroluminescent display device according to the first exemplary aspect of the present disclosure.

FIG. 2 illustrates a pad 175, a driving IC 176, and the flexible film 180 disposed on the display part DP and the encapsulation unit FSPM as compared to FIG. 3 and FIG. 4. The flexible film 180 may be as described with reference to FIG. 1.

FIG. 3 and FIG. 4 show examples of cross-sectional views of an upper side of a side portion of the display part DP to which the heat dissipation sheet 160 is attached. For the convenience of description, FIG. 3 and FIG. 4 schematically illustrate a pixel unit 125 in the active area AA and a GIP unit 126 in the non-active area NA.

FIG. 3 and FIG. 4 illustrate substantially the same configuration except some of components of sealing members 130' and 130, i.e., first adhesive layers 131' and 131, respectively. That is, FIG. 4 illustrates an example where a part of the first adhesive layer 131 is pressed into the hole H as the first adhesive layer 131 is laminated when the encapsulation unit FSPM is manufactured.

Further, FIG. 5 is a cross-sectional view showing a sub-pixel of the display part DP according to the first exemplary aspect of the present disclosure.

Referring to FIG. 2 through FIG. 5, a driving element 120 may be disposed on a substrate 101.

Further, a planarization layer 105 may be disposed on the driving element 120.

An organic light emitting diode 150 electrically connected to the driving element 120 is disposed on the planarization layer 105, and a capping layer 107 may be disposed on the organic light emitting diode 150.

Also, the sealing member 130' or 130 and a reinforcing substrate 140 may be sequentially disposed on the capping layer 107. However, the reinforcing substrate 140 may also be omitted.

However, the electroluminescent display device 100 according to the first exemplary aspect of the present disclosure is not limited to this laminated structure.

Specifically, the substrate 101 may be a glass or plastic substrate. If the substrate 101 is a plastic substrate, a polyimide-based or polycarbonate-based material may be used to have flexibility. In particular, polyimide may be applied to high temperature processes and is widely used for the plastic substrate because it is a material that may be coated.

A buffer layer 102 may be disposed on the substrate 101.

The buffer layer 102 serves to protect various electrodes/lines from impurities such as alkali ions or the like flowing out from the substrate 101 or lower layers. The buffer layer 102 may have a multilayer structure including a first buffer layer 102*a* and a second buffer layer 102*b*, but is not limited thereto. The buffer layer 102 may be formed of silicon oxide (SiOx), silicon nitride (SiNx), or a multilayer thereof.

Also, the buffer layer 102 may delay diffusion of moisture and/or oxygen permeating into the substrate 101. The buffer layer 102 may include a multi buffer and/or an active buffer. The active buffer protects an active layer 124, which is made of a semiconductor, of the driving element 120, and may serve to block various kinds of impurities introduced from the substrate 101. The active buffer may be made of amorphous silicon (a-Si) or the like.

The driving element 120 may be composed of the active layer 124, a gate electrode 121, a source electrode 122, and a drain electrode 123. The driving element 120 may be electrically connected to the organic light emitting diode 150 through a connection electrode 115 and thus may transmit a current or a signal to the organic light emitting diode 150.

The active layer 124 may be disposed on the buffer layer 102. The active layer 124 may be made of polycrystalline silicon (p-Si). In this case, a predetermined region may be doped with impurities. The active layer 124 may also be made of amorphous silicon (a-Si), or may be made of various organic semiconductor materials, such as pentacene. Alternatively, the active layer 124 may be made of an oxide semiconductor.

A gate insulating layer 103 may be disposed on the active layer 124.

The gate insulating layer 103 may be made of an inorganic insulating material, such as silicon oxide (SiOx) or silicon nitride (SiNx), or may be made of an organic insulating material.

The gate electrode 121 may be disposed on the gate insulating layer 103.

The gate electrode 121 may be made of various conductive materials, such as nickel (Ni), chromium (Cr), magnesium (Mg), aluminum (Al), molybdenum (Mo), tungsten (W), gold (Au), or an alloy thereof.

An interlayer insulating layer 104 may be disposed on the gate electrode 121.

The interlayer insulating layer 104 may be made of an insulating material such as silicon oxide (SiOx) or silicon nitride (SiNx), or may be made of an organic insulating material.

A contact hole may be formed by selectively removing the gate insulating layer 103 and the interlayer insulating layer 104 to expose a source region and a drain region of the active layer 124. For example, the source electrode 122 and the drain electrode 123 may be made of an electrode material in a monolayer structure or a multilayer structure on the interlayer insulating layer 104. Also, the source electrode 122 and the drain electrode 123 may be connected to the source region and the drain region, respectively.

If necessary, a passivation layer made of an inorganic insulating material may also be formed to cover the source electrode 122 and the drain electrode 123.

The planarization layer 105 may be disposed on the driving element 120 configured as described above.

The planarization layer 105 may have a multilayer structure including at least two layers. For example, the planarization layer 105 may include a first planarization layer 105*a* and a second planarization layer 105*b*. The first planarization layer 105*a* is disposed to cover the driving element 120 and may be disposed to expose a part of the source electrode 122 and a part of the drain electrode 123 of the driving element 120.

The planarization layer 105 may extend to the non-active area NA to cover the GIP unit 126.

The planarization layer 105 may have a thickness of about 2 μm, but is not limited thereto.

The planarization layer 105 may be an overcoat layer, but is not limited thereto.

Meanwhile, the connection electrode 115 may be disposed on the first planarization layer 105*a* to electrically connect the driving element 120 and the organic light emitting diode 150. Although not shown in FIG. 5, various metal layers serving as lines/electrodes such as a data line or a signal line may be disposed on the first planarization layer 105*a*.

Also, the second planarization layer 105*b* may be disposed on the first planarization layer 105*a* and the connection electrode 115.

That is, the planarization layer 105 is composed of two layers in the display part DP according to the first exemplary aspect of the present disclosure. This is because the number of various signal lines increases as the resolution of the display part DP increases. Accordingly, it is difficult to dispose all the lines in a single layer to be spaced apart by a minimum distance from each other. Thus, an additional layer is formed. The lines may be disposed with space to spare due to the additional layer, i. e., the second planarization layer 105*b*. Therefore, it may be easier to design the layout of lines/electrodes. Also, if a dielectric material is used for the planarization layer 105 having a multilayer structure, the planarization layer 105 may be used to form capacitance between metal layers.

The second planarization layer 105*b* may be formed to expose a part of the connection electrode 115. The drain electrode 123 of the driving element 120 may be electrically connected to an anode 151 of the organic light emitting diode 150 by the connection electrode 115.

The organic light emitting diode 150 may have a structure in which the anode 151, a plurality of organic layers 152, and a cathode 153 are sequentially disposed. That is, the organic light emitting diode 150 may be composed of the anode 151 formed on the planarization layer 105, the organic layer 152 formed on the anode 151, and the cathode 153 formed on the organic layer 152.

The electroluminescent display device 100 may be of a top emission type or a bottom emission type depending on the direction of light emission. For the top emission type, light emitted from the organic layer 152 may be reflected from the anode 151 toward an upward direction, i.e., toward the cathode 153 thereabove. To this end, a reflective layer made of an opaque conductive material having high reflectance such as silver (Ag), aluminum (Al), gold (Au), molybdenum (Mo), tungsten (W), chromium (Cr) or an alloy thereof may be further disposed under the anode 151. For the bottom emission type, the anode 151 may be made of a transparent conductive material such as indium tin oxide (ITO), indium zinc oxide (IZO), and indium gallium zinc oxide (IGZO) or the like. Hereinafter, the electroluminescent display device 100 of the present disclosure will be described as a bottom emission type electroluminescent display device.

A bank 106 may be formed on the planarization layer 105 except an emission area. That is, the bank 106 may have a bank hole through which the anode 151 corresponding to the emission area is exposed. The bank 106 may be made of an inorganic insulating material, such as silicon nitride (SiNx) or silicon oxide (SiOx), or an organic insulating material, such as BCB, an acrylic resin and an imide-based resin.

The bank 106 may extend to the non-active area NA.

The bank 106 may extend to a part of the non-active area NA to be spaced apart at a predetermined distance from a tip end of the substrate 101.

The bank 106 may have a thickness of about 1 μm, but is not limited thereto.

The bank 106 may cover an upper part of the GIP unit 126, but is not limited thereto.

The organic layer 152 may be disposed on the anode 151 exposed by the bank 106. The organic layer 152 may include an emission layer, an electron injection layer, an electron transport layer, a hole transport layer, a hole injection layer, and the like.

The organic layer 152 may extend to the non-active area NA.

The organic layer 152 may extend to a part of the non-active area NA to be spaced apart from a tip end of the bank 106 at a predetermined distance.

In the non-active area NA, the organic layer 152 may be disposed on the bank 106.

The cathode 153 may be disposed on the organic layer 152.

For the top emission type, the cathode 153 may contain a transparent conductive material. For example, the cathode 153 may be made of indium tin oxide (ITO), indium zinc oxide (IZO), indium gallium zinc oxide (IGZO), or the like. For the bottom emission type, the cathode 153 may contain any one of the group consisting of metal materials such as gold (Au), silver (Ag), aluminum (Al), molybdenum (Mo), magnesium (Mg), palladium (Pd) and copper (Cu), or alloys thereof. Alternatively, the cathode 153 may have a laminated structure. The laminated structure may include a layer made of a transparent conductive material such as indium tin oxide (ITO), indium zinc oxide (IZO) or indium gallium zinc oxide (IGZO). Also, the laminated structure may include a layer made of a metal material such as gold (Au), silver (Ag), aluminum (Al), molybdenum (Mo), magnesium (Mg), palladium (Pd) and copper (Cu), or an alloy thereof. However, the present disclosure is not limited thereto.

The cathode 153 may extend to the non-active area NA.

The cathode 153 may be spaced apart from the tip end of the bank 106 at a predetermined distance to be in contact with a part of an upper surface of the bank 106.

In the non-active area NA, the cathode 153 may be disposed to cover a side surface of the organic layer 152. In this case, the organic layer 152 may be disposed to be spaced apart at a predetermined distance from a tip end of the cathode 153. However, the present disclosure is not limited thereto.

The capping layer 107 made of a material having high refractive index and light absorbance may be disposed on the organic light emitting diode 150 to reduce diffused reflection of external light.

The capping layer 107 may be an organic layer made of an organic material, and may be omitted if necessary.

The capping layer 107 may extend to the non-active area NA. In the non-active area NA, the capping layer 107 may be disposed on the cathode 153.

An encapsulation structure having a multilayer structure composed of the sealing member 130' or 130 and the reinforcing substrate 140 may be disposed on the cathode 153. However, the present disclosure is not limited thereto. The reinforcing substrate 140 may be omitted if necessary.

A small-sized display panel used in mobile and portable devices has a small panel area. Thus, heat is rapidly dissipated from a device and there is little problem of adhesion. However, a large-sized panel used in monitors, tablets, and television sets has a large panel area. Thus, an encapsulation structure is required for optimal heat dissipation and adhesion.

Further, to compensate for the insufficient rigidity, the electroluminescent display device may further include a separate inner plate disposed on an encapsulation structure. In this case, it is necessary to secure a space for receiving therein the separate inner plate. Due to the weight of the inner plate, there is a limit in slimming and weight reduction of the electroluminescent display device. Furthermore, an air gap is generated due to a vertical separation space between the encapsulation substrate and the inner plate by a thickness of an adhesive tape disposed to attach the encapsulation substrate and the inner plate to each other. The air gap may be located adjacent to the end of the tape and may have a similar thickness to that of the tape. Due to the air gap, heat dissipation may be reduced.

Accordingly, in the first exemplary aspect of the present disclosure, the encapsulation structure having a multilayer structure including the sealing member 130' or 130 may be introduced. In the encapsulation structure, the separate inner plate may be removed and the reinforcing substrate 140 having a relatively larger thickness may be fixed. Thus, the encapsulation structure may suppress the occurrence of a process defect. The reinforcing substrate may provide additional rigidity which allows the encapsulation structure to be applied more reliably and with fewer dust or other process defects from occurring in the boundary between the encapsulation layer and the display panel (or TFT panel).

The sealing member 130' or 130 of the present disclosure may include the first adhesive layer 131' or 131 facing toward the substrate 101 and a second adhesive layer 133 facing toward the reinforcing substrate 140. Also, the sealing member 130' or 130 may include a barrier layer 132 disposed between the first adhesive layer 131' or 131 and the second adhesive layer 133.

Each of the first adhesive layer 131' or 131 and the second adhesive layer 133 may be made of a polymer material having adhesiveness. For example, the first adhesive layer 131' or 131 may be made of a polymer material of one of olefin-based, epoxy-based and acrylate-based polymers. Further, the second adhesive layer 133 may be made of a polymer material of one of olefin-based, epoxy-based, acrylate-based, amine-based, phenol-based and acid anhydride-based polymers which do not contain a carboxyl group. In particular, the second adhesive layer 133 may be made of a polymer material which does not contain the carboxyl group for film uniformity and corrosion suppression of the barrier layer 132.

For heat dissipation of the substrate 101, at least the first adhesive layer 131' or 131 among the first and second adhesive layers 131' or 131 and 133 may be made of a mixture including the polymer material having adhesiveness and metallic particles. For example, the metallic particles may be powder made of Ni. The first adhesive layer 131' or 131 in direct contact with the substrate 101 is made of the mixture including the polymer material having adhesiveness and the metallic particles. Thus, the first adhesive layer 131' or 131 may have higher thermal conductivity than the polymer material having adhesiveness.

Likewise, the second adhesive layer 133 is made of a mixture including the polymer material having adhesiveness and the metallic particles. Thus, the second adhesive layer 133 may have higher thermal conductivity than the polymer material having adhesiveness.

In this way, a rate at which heat generated from the substrate 101 is dissipated through the sealing member 130' or 130 may be improved. Therefore, the heat dissipation from the substrate 101 may be improved.

Further, to suppress moisture permeation into the pixel unit 125, the first adhesive layer 131' or 131 may be made of a mixture further including a hygroscopic inorganic filler. The hygroscopic inorganic filler may be at least one of barium oxide (BaO), calcium oxide (CaO), and magnesium oxide (MgO).

Unlike the first adhesive layer 131' or 131, the second adhesive layer 133 is not in direct contact with the pixel unit 125. Thus, there is no need for the second adhesive layer 133 to include the hygroscopic inorganic filler for suppressing moisture permeation into the pixel unit 125. Therefore, the second adhesive layer 133 does not include the hygroscopic inorganic filler, but may include only the polymer material having adhesiveness and the metallic particles. In this way, the amount of a relatively expensive hygroscopic inorganic filler injected into the sealing member 130' or 130 may be reduced. Therefore, the cost of preparing the sealing member 130' or 130 may be reduced.

Further, as the second adhesive layer 133 does not include the hygroscopic inorganic filler, a mixing ratio of the polymer material included in the second adhesive layer 133 may be increased, compared to that in the first adhesive layer 131' or 131. Thus, the adhesiveness of the second adhesive layer 133 may be higher than that of the first adhesive layer 131' or 131. Accordingly, as the reinforcing substrate 140 is more firmly fixed onto the second adhesive layer 133, the reliability of adhesion between the substrate 101 and the reinforcing substrate 140 may be further improved.

As the sealing member has a multilayer structure composed of the first adhesive layer 131' or 131 and the second adhesive layer 133, the amount of warpage by which the display panel is bent may be reduced. Thus, the reliability may also be improved.

Each of the first and second adhesive layers 131' or 131 and 133 may have a thickness limited to be equal to or smaller than a threshold thickness at which a process defect may be suppressed. Also, the sum of the thicknesses of the first and second adhesive layers 131' or 131 and 133 may be limited to be equal to or greater than a threshold thickness at which the reliability in fixing the reinforcing substrate 140 may be secured.

For example, each of the first and second adhesive layers 131' or 131 and 133 may have a thickness in the range of 10 μm to 100 μm.

The barrier layer 132 may be made of a metal material. That is, the barrier layer 132 may include a metal material such as Al, Cu, Sn, Ag, Fe, or Zn.

The barrier layer 132 may be introduced to implement a laminated structure for reinforcing the adhesion with the first and second adhesive layers 131' or 131 and 133 and reducing warpage.

Specifically, each of the first and second adhesive layers 131' or 131 and 133 includes a polymer material having adhesiveness. Accordingly, the barrier layer 132 made of a relatively hard material is disposed between the first adhesive layer 131' or 131 and the second adhesive layer 133. Thus, the first adhesive layer 131' or 131 and the second adhesive layer 133 are attached to one surface and the other surface of the barrier layer 132, respectively. Therefore, it is possible to improve adhesion.

In this case, the thickness of the barrier layer 132 may be limited to be smaller than the thicknesses of the first and second adhesive layers 131' or 131 and 133 to minimize an increase in thickness of the sealing member 130' or 130 caused by the barrier layer 132. For example, the thickness of the barrier layer 132 may be greater than 10 μm and smaller than each of the thicknesses of the first and second adhesive layers 131' or 131 and 133.

The sealing member 130' or 130 according to the first exemplary aspect of the present disclosure includes the first and second adhesive layers 131' or 131 and 133 separated via the barrier layer 132. Thus, the sealing member 130' or 130 may have a thickness of about twice that of a single-layer adhesive material while suppressing the occurrence of a process defect. Accordingly, the reinforcing substrate 140 fixed by the sealing member 130' or 130 may have a greater thickness. Therefore, the rigidity may be increased and the heat dissipation may be easily implemented. That is, when the sealing member 130' or 130 has a thickness in the range of 30 μm to 300 μm, the reinforcing substrate 140 may have a thickness in the range of 0.1 mm to 1.5 mm.

For example, the reinforcing substrate 140 may be made of one material selected from glass and plastic polymers such as PET.

Herein, the sealing member 130' or 130 and the reinforcing substrate 140 may extend to the non-active area NA to cover a part of the planarization layer 105 and a part of the bank 106.

As described above, according to the present disclosure, the encapsulation structure has a multilayer structure including the relatively thick reinforcing substrate 140. Thus, it is possible to achieve sufficient rigidity and heat dissipation. However, if a plastic polymer such as PET is used for the reinforcing substrate 140, it is difficult to suppress EMI. That is, according to the conventional method, the conductive tape is attached to the surfaces of the heat dissipation sheet and the reinforcing substrate, and a cross-section of the sealing member is electrically connected to the conductive tape through the silver dots. In this case, when the encapsulation unit is cut, the reinforcing substrate made of PET may flow down along the side surface of the sealing member and cover the side surface of the barrier layer made of Al foil. Thus, electrical connection between the silver dots and the barrier layer may not be made.

Therefore, according to the present disclosure, the hole H is formed to penetrate the reinforcing substrate 140. A conductive member is disposed in the hole to electrically connect the barrier layer 132 of the sealing member 130' or 130 and a conductive tape 171. The conductive member may be a conductive paste 172 which has been injected into/through the hole H. Thus, it is possible to improve (i.e., reduce) EMI. For reference, the conductive tape 171 electrically connected to the barrier layer 132 through the conductive paste 172 may be attached to the heat dissipation sheet 160. Also, the conductive tape 171 may be electrically connected to a cover bottom made of a metal via a printed circuit board through another conductive tape.

According to the first exemplary aspect of the present disclosure, the hole H may penetrate a part of the reinforcing substrate 140 and parts of the second adhesive layer 133 and the barrier layer 132 of the sealing member 130' or 130. Meanwhile, if the reinforcing substrate 140 is omitted, the hole H may penetrate parts of the second adhesive layer 133 and the barrier layer 132 of the sealing member 130' or 130.

The hole H may be formed by a punching process.

The hole H may be formed in the reinforcing substrate 140, the second adhesive layer 133 and the barrier layer 132. Also, the conductive paste 172 may be injected into and filled in the hole H. Thus, the barrier layer 132 of the sealing member 130' or 130 may be electrically connected to the conductive tape 171 in an improved manner (e.g., without the need for other connection configurations such as a conductive paste flowing over the reinforcing substrate 140.

The conductive member (e.g., conductive paste 172 injected into the hole H may be in contact with a side surface of the barrier layer 132, and the conductive tape 171 is electrically connected to the conductive paste 172. This may be achieved by providing the conductive tape attached onto the conductive paste 172. For example, the conductive tape is applied onto the uppermost surface of the uppermost layer which the hole penetrates (i.e., the uppermost surface of the reinforcing substrate 140 or the second adhesive layer 133). Thus, the barrier layer 132 of the sealing member 130' or 130 may be electrically connected to the conductive tape 171 via the conductive member.

Here, referring to FIG. 4, as described above, a part of the first adhesive layer 131 may be pressed into the hole H as the first adhesive layer 131 is laminated when the encapsulation unit FSPM is manufactured. In this case, the first adhesive layer 131 may protrude convexly into the hole H. However, the present disclosure is not limited thereto. As shown in FIG. 3, the first adhesive layer 131' may have a flat upper surface.

According to the first exemplary aspect of the present disclosure, the hole H is located closer to the active area AA than the heat dissipation sheet 160. However, the present disclosure is not limited thereto. That is, according to the present disclosure, the hole H may be located closer to the active area AA than the heat dissipation sheet 160 and may also be located farther from the active area AA than the heat dissipation sheet 160. Further, the hole H may be located in the active area AA.

Meanwhile, the pad 175 and the driving IC 176 may be disposed on the heat dissipation sheet 160. In this way, the heat dissipation sheet 160 also helps to dissipate heat from the pad and/or the driving IC.

Also, the flexible film 180 may be attached to a tip end of the display part DP (e. g., at or immediately adjacent to its edge) to cover the pad 175 and the driving IC 176. Further, a side surface sealant 181 may be formed on a side surface (i. e., edge) of the display part DP. The side surface sealant 181 may serve to block moisture permeating into the pixel unit 125.

Furthermore, a moisture-proof resin 182 may be coated onto a bonding portion between the display part DP and the flexible film 180 to suppress moisture permeation. Herein, the moisture-proof resin 182 and the side surface sealant 181 may be an epoxy-based resin called "Tuffy®", but are not limited thereto.

Meanwhile, a part of a manufacturing process of the electroluminescent display device including the ground structure according to the present disclosure will be described in detail with reference to the accompanying drawings.

FIG. 6A through FIG. 6D are plan views sequentially illustrating a part of a manufacturing process of the electroluminescent display device of FIG. 1.

FIG. 7A through FIG. 7D are cross-sectional views sequentially illustrating a part of the manufacturing process of the electroluminescent display device of FIG. 4.

Figure 6A:
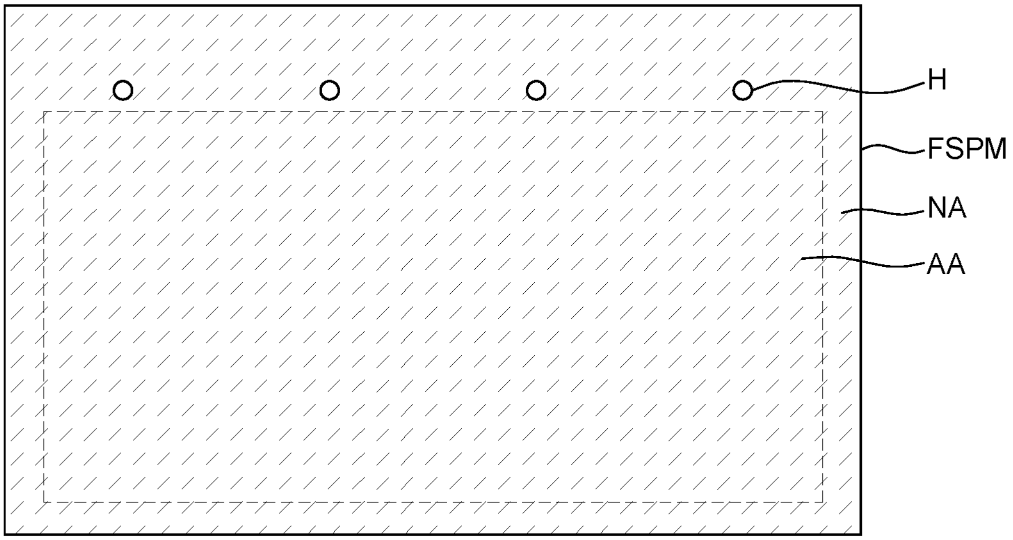
FIG. 6A through FIG. 6D are plan views sequentially illustrating a part of a manufacturing process of the electroluminescent display device of FIG. 1.
Figure 7A:
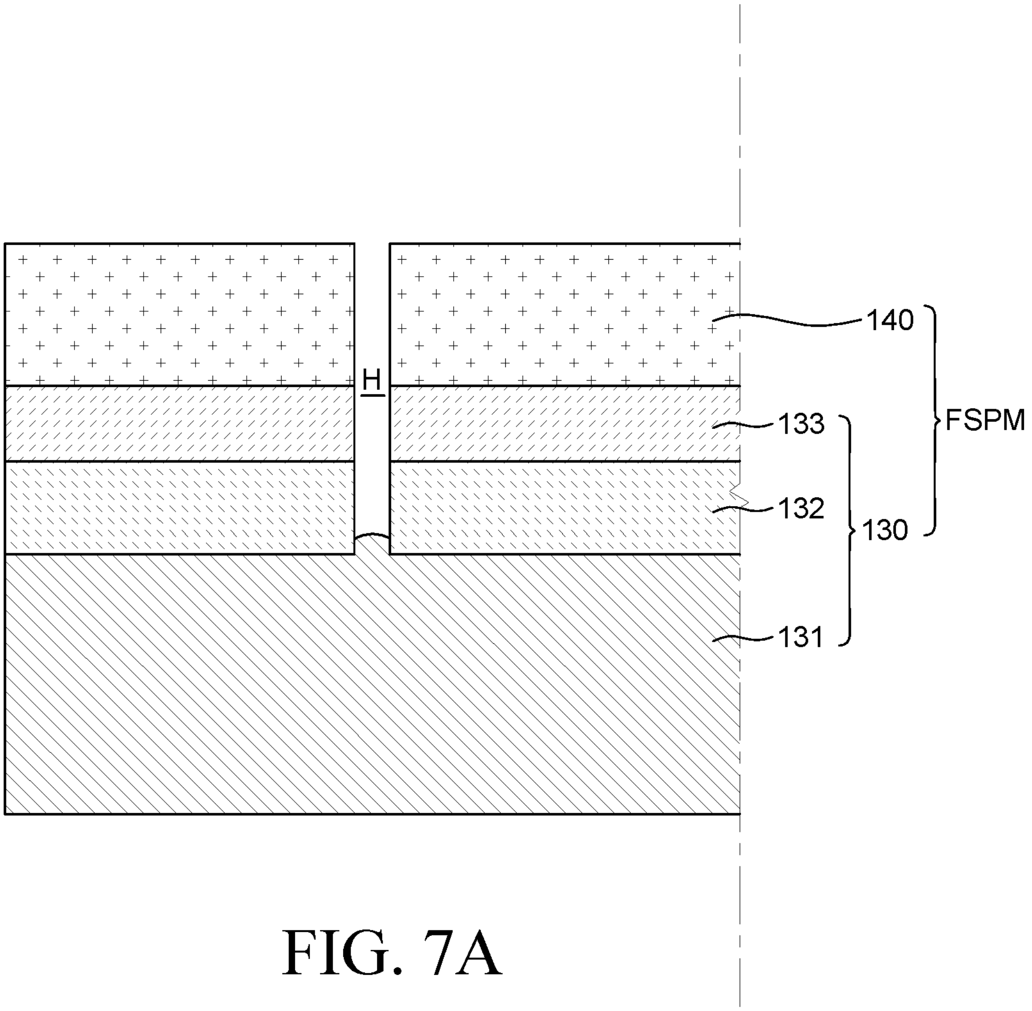
FIG. 7A through FIG. 7D are cross-sectional views sequentially illustrating a part of the manufacturing process of the electroluminescent display device of FIG. 4.

Referring to FIG. 6A and FIG. 7A, a part of the encapsulation unit FSPM including a part of the sealing member 130 and the reinforcing substrate 140 is prepared. Herein, the part of the encapsulation unit FSPM may include the second adhesive layer 133 and the barrier layer 132 of the sealing member 130, and the reinforcing substrate 140.

That is, after the hole H is formed in the part of encapsulation unit FSPM, the first adhesive layer 131 may be attached to a lower surface of the barrier layer 132.

Each of the first adhesive layer 131 and the second adhesive layer 133 may be made of a polymer material having adhesiveness. For example, the first adhesive layer 131 may be made of a polymer material of one of olefin-based, epoxy-based and acrylate-based polymers. Further, the second adhesive layer 133 may be made of a polymer material of one of olefin-based, epoxy-based, acrylate-based, amine-based, phenol-based and acid anhydride-based polymers which do not contain a carboxyl group.

At least the first adhesive layer 131 among the first and second adhesive layers 131 and 133 may be made of a mixture including the polymer material having adhesiveness and metallic particles. For example, the metallic particles may be powder made of Ni.

Likewise, the second adhesive layer 133 is made of a mixture including the polymer material having adhesiveness and the metallic particles. Thus, the second adhesive layer 133 may have higher thermal conductivity than the polymer material having adhesiveness.

Further, the first adhesive layer 131 may be made of a mixture further including a hygroscopic inorganic filler. The hygroscopic inorganic filler may be at least one of barium oxide (BaO), calcium oxide (CaO), and magnesium oxide (MgO).

The second adhesive layer 133 does not include the hygroscopic inorganic filler, but may include only the polymer material having adhesiveness and the metallic particles.

Each of the first and second adhesive layers 131 and 133 may have a thickness limited to be equal to or smaller than a threshold thickness at which a process defect may be suppressed. Also, the sum of the thicknesses of the first and second adhesive layers 131 and 133 may be limited to be equal to or greater than a threshold thickness at which the reliability in fixing the reinforcing substrate 140 may be secured. Each of the first and second adhesive layers 131 and 133 may have a thickness in the range of 10 μm to 100 μm. For example, the first adhesive layer 131 may have a thickness of about 75 μm and the second adhesive layer 133 may have a thickness of about 50 μm, but are not limited thereto.

The barrier layer 132 may be made of a metal material. For example, the barrier layer 132 may include a metal material such as Al, Cu, Sn, Ag, Fe, or Zn.

The thickness of the barrier layer 132 may be limited to be smaller than the thicknesses of the first and second adhesive layers 131 and 133 to minimize an increase in thickness of the sealing member 130 caused by the barrier layer 132. In this case, the thickness of the barrier layer 132 may be greater than 10 lam and smaller than each of the thicknesses of the first and second adhesive layers 131 and 133. For example, the barrier layer 132 may have a thickness of about 30 but is not limited thereto.

For example, the reinforcing substrate 140 may be made of one material selected from glass and plastic polymers such as PET. For example, the reinforcing substrate 140 may have a thickness of about 75 μm, but is not limited thereto.

Then, a punching process is performed to an upper portion or a lower portion of the part of the encapsulation unit FSPM, i.e., the reinforcing substrate 140, the second adhesive layer 133, and the barrier layer 132. As a result, the hole H penetrating the reinforcing substrate 140, the second adhesive layer 133, and the barrier layer 132 may be formed.

The shape of the hole H is not limited to the illustrated circular shape (i.e., shape of the cross-section perpendicular to the central axis of the hole), and may be one of various shapes including a polygonal shape, such as a triangular shape and a quadrangular shape, an oval shape, or the like.

Also, the number of holes H is not limited to 4 as shown in the drawings, but may be 1 to 3, or 5 or more.

The hole H may be located around the active area AA, i.e., closer to the active area AA than the heat dissipation sheet, as shown in the drawings. Alternatively, the hole H may be located farther from the active area AA than the heat dissipation sheet, or may be located in the active area AA.

Thereafter, the first adhesive layer 131 may be attached (laminated) to a lower surface of the part of the encapsulation unit FSPM, i.e., the reinforcing substrate 140, the second adhesive layer 133, and the barrier layer 132, in which the hole H is formed.

Herein, when the first adhesive layer 131 is laminated, a part of the first adhesive layer 131 may be pressed into the hole H. In this case, the first adhesive layer 131 may protrude convexly into the hole H. However, the present disclosure is not limited thereto.

Figure 6B:
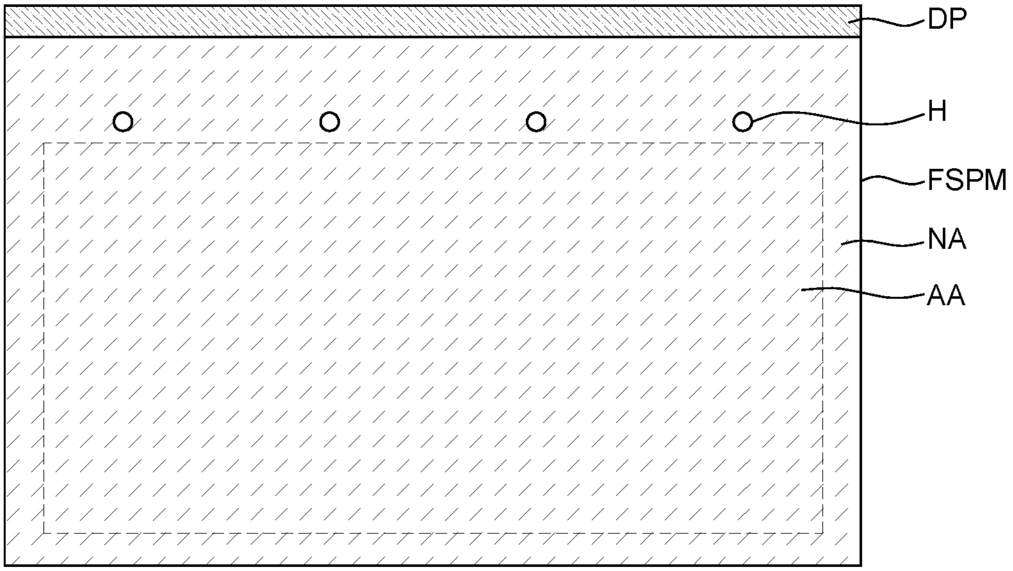
Figure 7B:
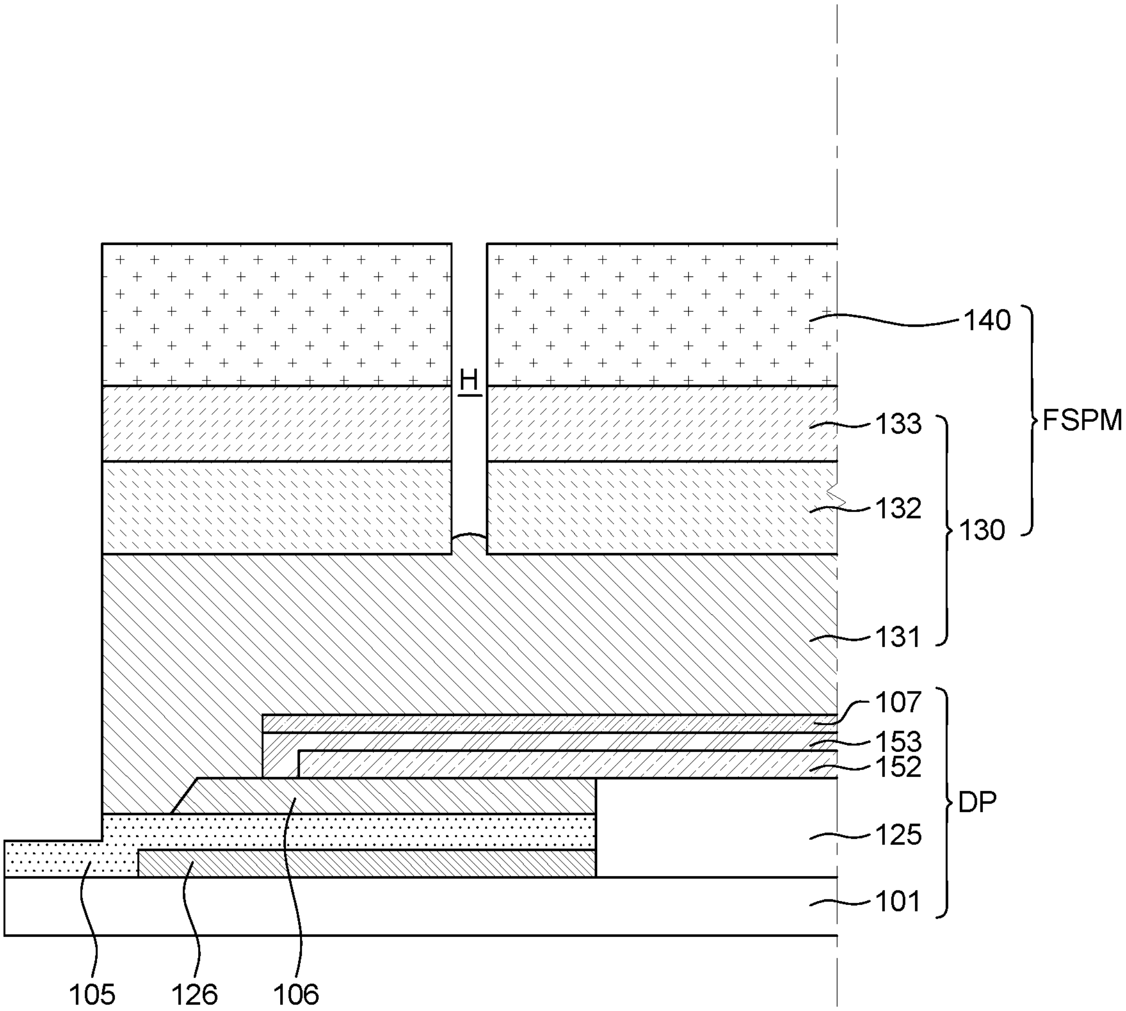

Referring to FIG. 6B and FIG. 7B, the encapsulation unit FSPM in which the hole H is formed may be bonded to the display part DP by using the first adhesive layer 131.

Figure 6C:
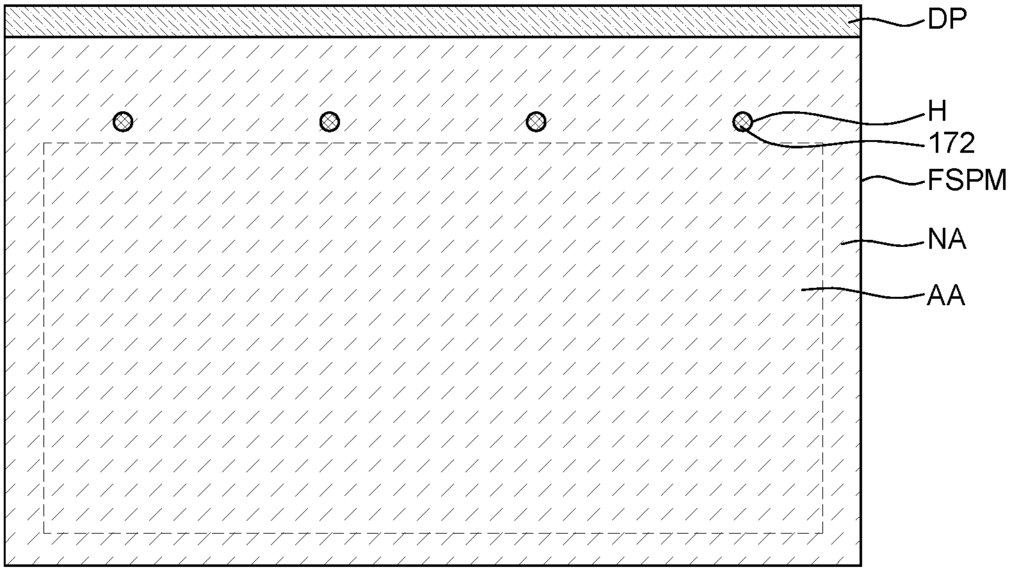
Figure 7C:
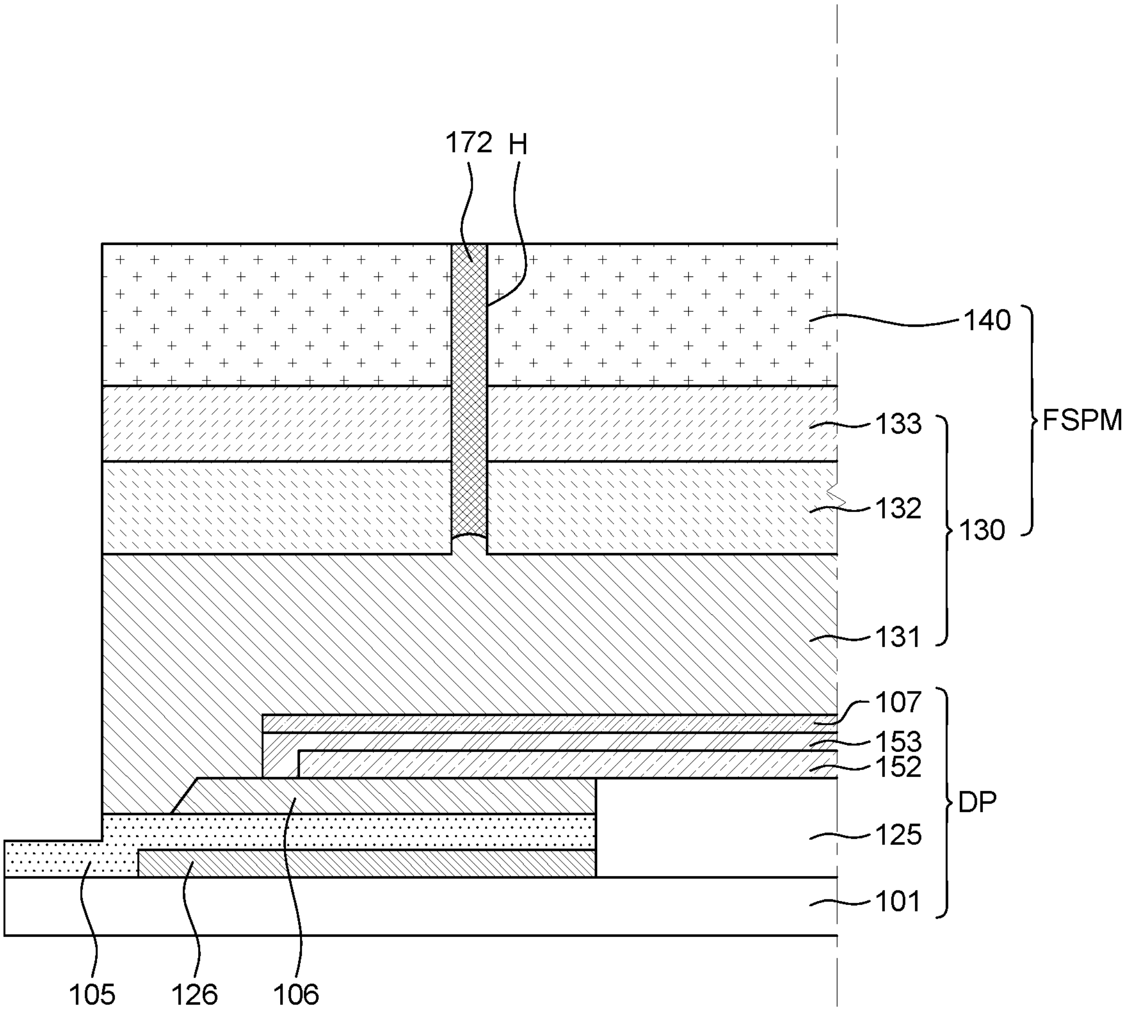

Then, referring to FIG. 6C and FIG. 7C, the conductive paste 172 may be coated to fill in the hole H.

For example, the conductive paste 172 may include a silver paste.

The conductive paste 172 may be in contact with the side surface of the barrier layer 132 exposed by the hole H.

The conductive paste 172 may also be coated onto a part of an upper surface of the reinforcing substrate 140.

Figure 6D:
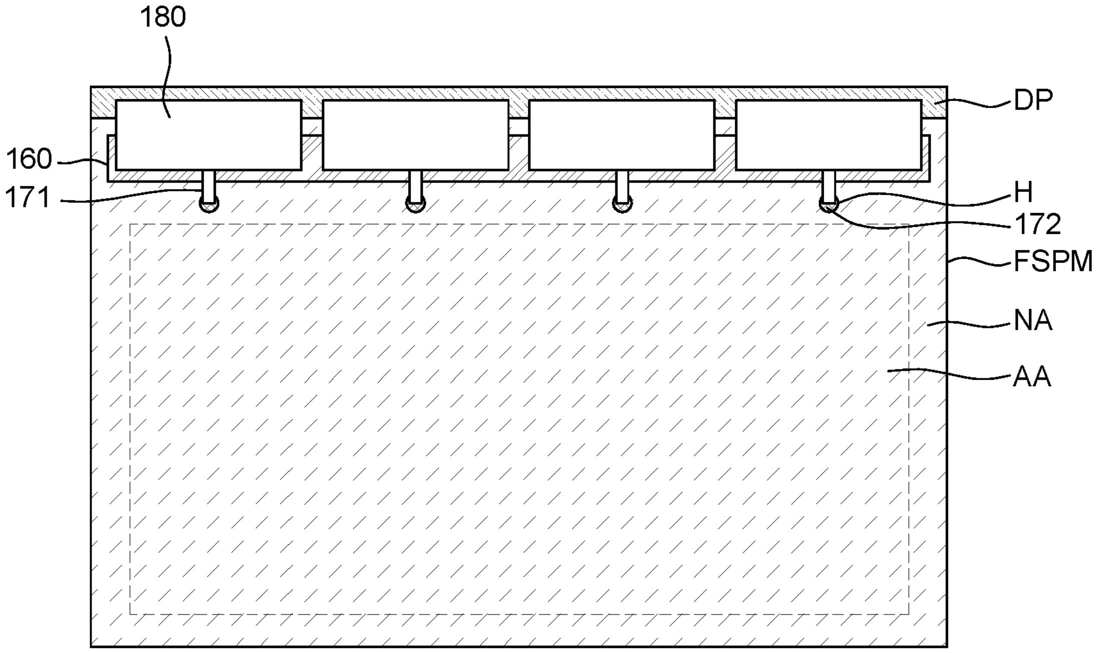
Figure 7D:
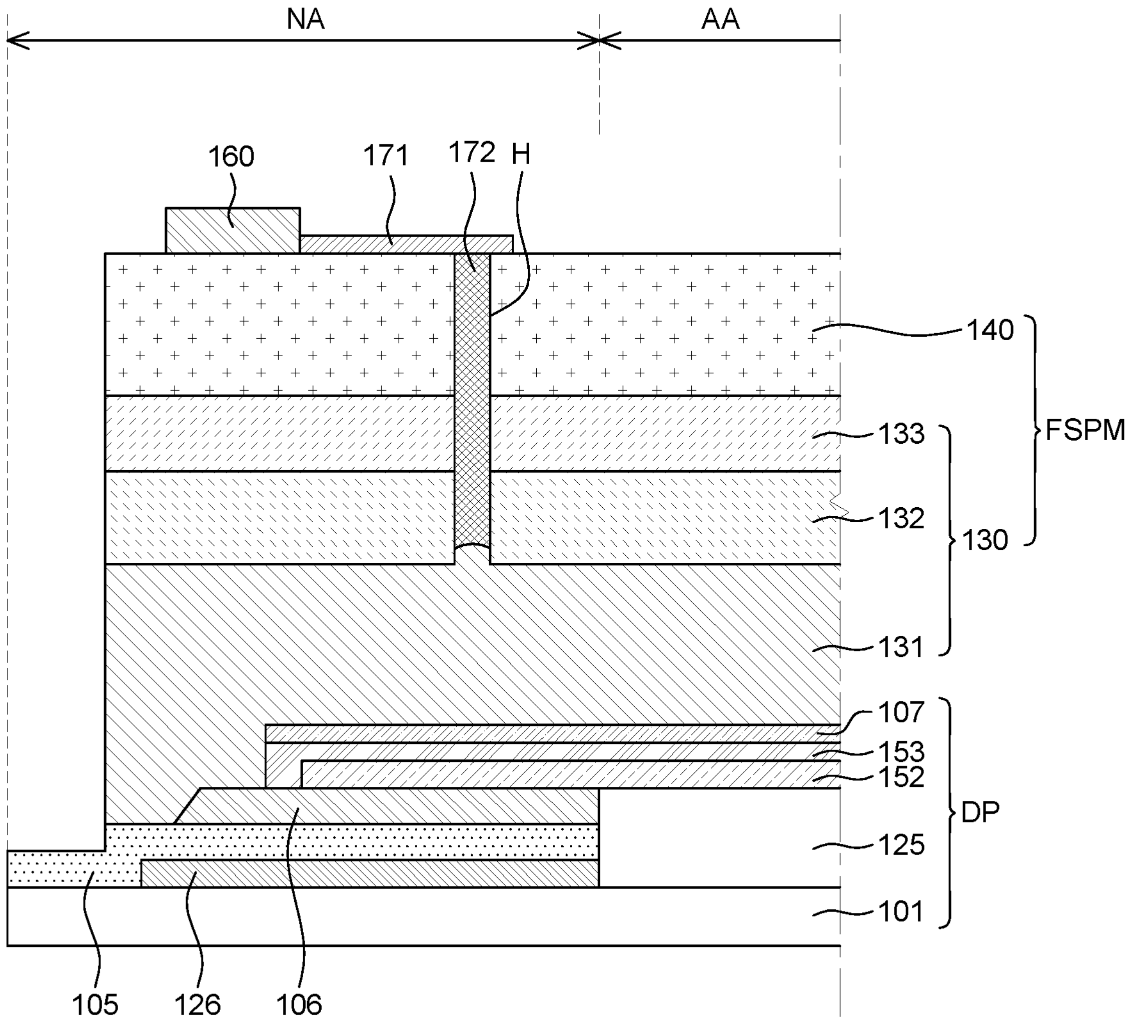

Thereafter, referring to FIG. 6D and FIG. 7D, a predetermined amount of the conductive tape 171 may be attached to an upper surface of the encapsulation unit FSPM.

The conductive tape 171 may be attached to the upper surface of the encapsulation unit FSPM to cover the conductive paste 172.

Before or after the conductive tape 171 is attached, the heat dissipation sheet 160 may be attached to a part of the upper surface of the encapsulation unit FSPM. The barrier layer 132 and the conductive paste 172 may be electrically connected to the heat dissipation sheet 160 by the conductive tape 171.

The hole H may be located closer to the active area AA than the heat dissipation sheet 160. However, as described above, the hole H may be located farther from the active area AA than the heat dissipation sheet 160. This will be described in detail with reference to FIG. 8 and FIG. 9.

Figure 8:
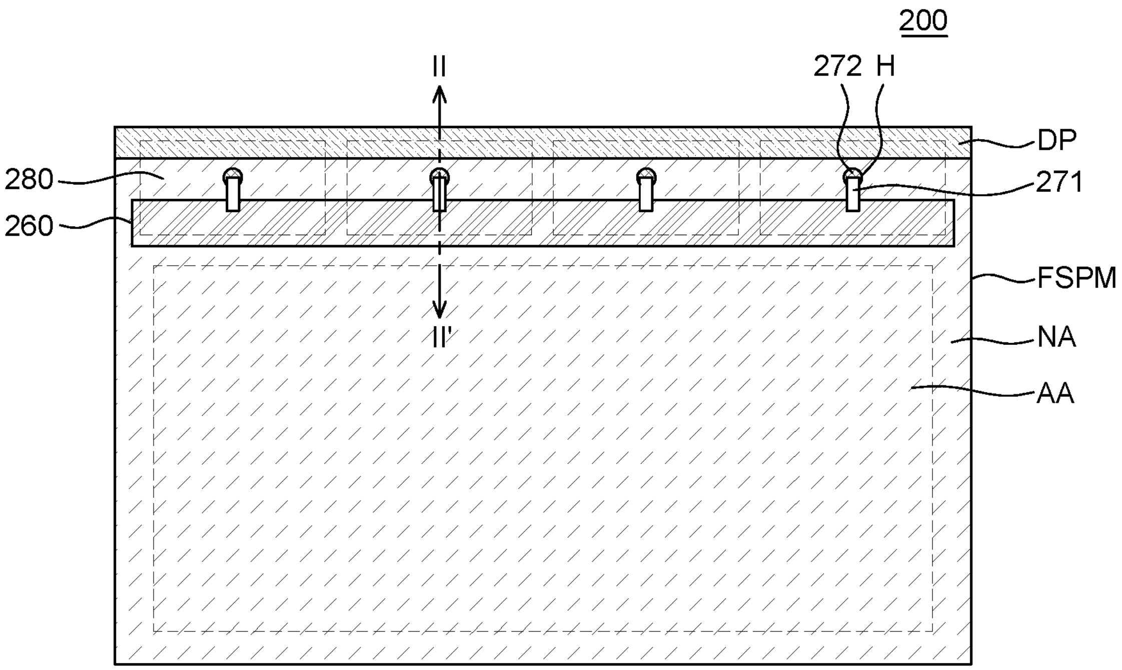
FIG. 8 is a plan view schematically illustrating an electroluminescent display device according to a second exemplary aspect of the present disclosure.

FIG. 8 is a plan view schematically illustrating an electroluminescent display device according to a second exemplary aspect of the present disclosure.

Figure 9:
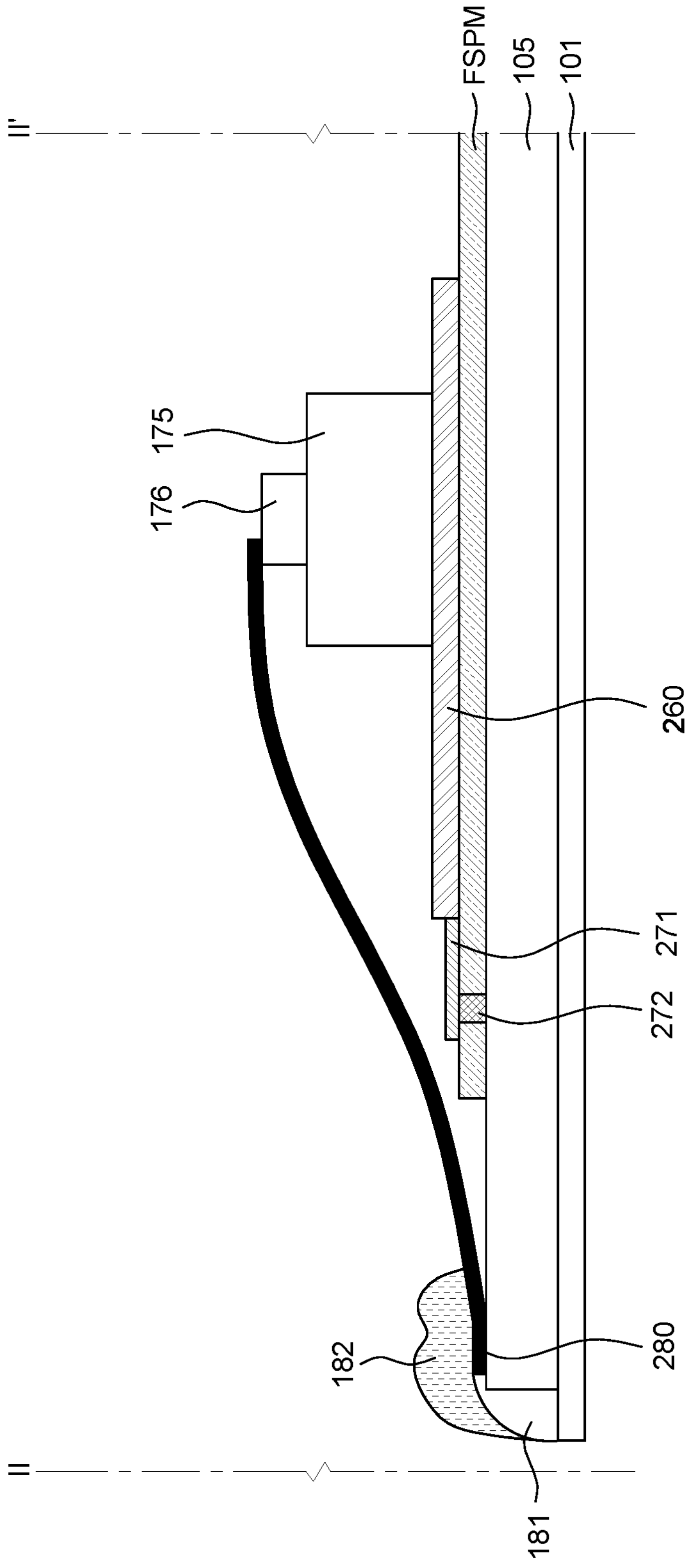
FIG. 9 is a cross-sectional view as taken along line II-IF of FIG. 8.

FIG. 9 is a cross-sectional view as taken along line II-IF of FIG. 8.

An electroluminescent display device 200 according to the second exemplary aspect as shown in FIG. 8 and FIG. 9 is substantially the same as the electroluminescent display device 100 according to the first exemplary aspect as shown in FIG. 1 and FIG. 2 except the positions of the hole H, a conductive tape 271, and a conductive paste 272. Therefore, a repeated description thereof will be omitted.

Referring to FIG. 8 and FIG. 9, the electroluminescent display device 200 according to the second exemplary aspect of the present disclosure may include the display part DP, the encapsulation unit FSPM, and a heat dissipation sheet 260. The electroluminescent display device 200 may further include a flexible film 280.

The encapsulation unit FSPM may be disposed on the display part DP.

The encapsulation unit FSPM may be composed of a sealing member and a reinforcing substrate.

The heat dissipation sheet 260 may be disposed on the encapsulation unit FSPM. However, the present disclosure is not limited thereto.

As described above, the hole H may be formed to penetrate a part of the reinforcing substrate and parts of the second adhesive layer and the barrier layer of the sealing member.

The conductive paste 272 may be injected into the hole H and may be in contact with a side surface of the barrier layer.

According to the second exemplary aspect of the present disclosure, the hole H is located farther from the active area AA than the heat dissipation sheet 260. In this case, due to the formation of the hole H, the heat dissipation sheet 260 may be located closer to the active area AA than in the first exemplary aspect of the present disclosure.

The conductive tape 271 may also be located farther from the active area AA than the heat dissipation sheet 260 to electrically connect the conductive paste 272 to the heat dissipation sheet 260.

The pad 175 and the driving IC 176 may be further disposed on the heat dissipation sheet 260. In this case, like the heat dissipation sheet 260, the pad 175 and the driving IC 176 may be located closer to the active area AA than in the first exemplary aspect of the present disclosure.

Also, the flexible film 280 may be attached to the tip end of the display part DP to cover the pad 175 and the driving IC 176. In this case, due to the movement of the pad 175 and the driving IC 176, the flexible film 280 may further extend toward the active area AA than in the first exemplary aspect of the present disclosure.

Further, the side surface sealant 181 may be formed on the side surface of the display part DP.

Furthermore, the moisture-proof resin 182 may be coated onto a bonding portion between the display part DP and the flexible film 280 to suppress moisture permeation.

Meanwhile, the second adhesive layer may flow upwards or downwards depending on a punching direction during a punching process for forming the hole H. This will be described in detail with reference to FIG. 10 and FIG. 11.

Figure 10:
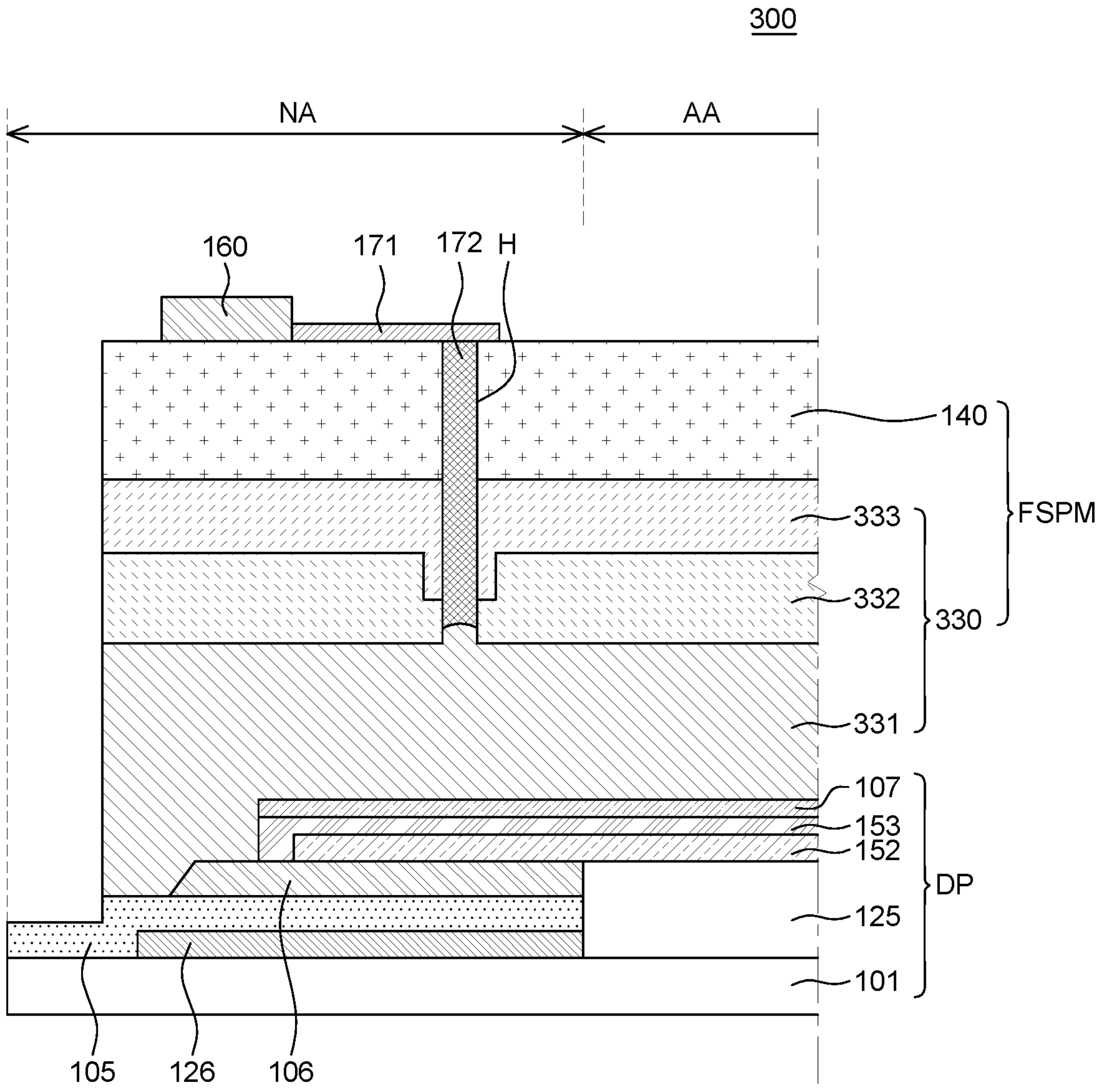
FIG. 10 is a cross-sectional view schematically illustrating an electroluminescent display device according to a third exemplary aspect of the present disclosure.

FIG. 10 is a cross-sectional view schematically illustrating an electroluminescent display device according to a third exemplary aspect of the present disclosure.

An electroluminescent display device 300 according to the third exemplary aspect as shown in FIG. 10 is substantially the same as the electroluminescent display device 100 according to the first exemplary aspect as shown in FIG. 3 except a configuration of a sealing member 330. Therefore, a repeated description thereof will be omitted.

FIG. 10 shows an example of a cross-sectional view of the upper side of the side portion of the display part DP to which the heat dissipation sheet 160 is attached. For the convenience of description, FIG. 10 schematically illustrates the pixel unit 125 in the active area AA and the GIP unit 126 in the non-active area NA.

Referring to FIG. 10, the encapsulation unit FSPM may be disposed on the display part DP.

The encapsulation unit FSPM may be composed of the sealing member 330 and the reinforcing substrate 140.

The heat dissipation sheet 160 may be disposed on the encapsulation unit FSPM. However, the present disclosure is not limited thereto.

As in the first and second exemplary aspects, the sealing member 330 may include a first adhesive layer 331 facing toward the substrate 101 and a second adhesive layer 333 facing toward the reinforcing substrate 140. Also, the sealing member 330 may include a barrier layer 332 disposed between the first adhesive layer 331 and the second adhesive layer 333.

Further, the hole H may be formed to penetrate a part of the reinforcing substrate 140 and parts of the second adhesive layer 333 and the barrier layer 332 of the sealing member 330.

The hole H may be formed by a punching process.

In the third exemplary aspect of the present disclosure, the punching process is performed downwards from an upper portion of the reinforcing substrate 140. In this case, a part of an upper end of the barrier layer 332 may be pressed downwards during the punching process so that a space having a greater diameter than the hole H is formed in the barrier layer. The second adhesive layer 333 may flow down into the space. Thus, a contact area between the barrier layer 332 and the conductive paste 172 may decrease. The shape of the space is not limited to the circular shape, and may include various shapes, as long as the sectional area of the space is larger than that of the hole H.

The conductive paste 172 injected into the hole H may be in contact with a side surface of the barrier layer 332, and the conductive tape 171 is attached onto the conductive paste 172. Thus, the barrier layer 332 of the sealing member 330 may be electrically connected to the conductive tape 171.

Figure 11:
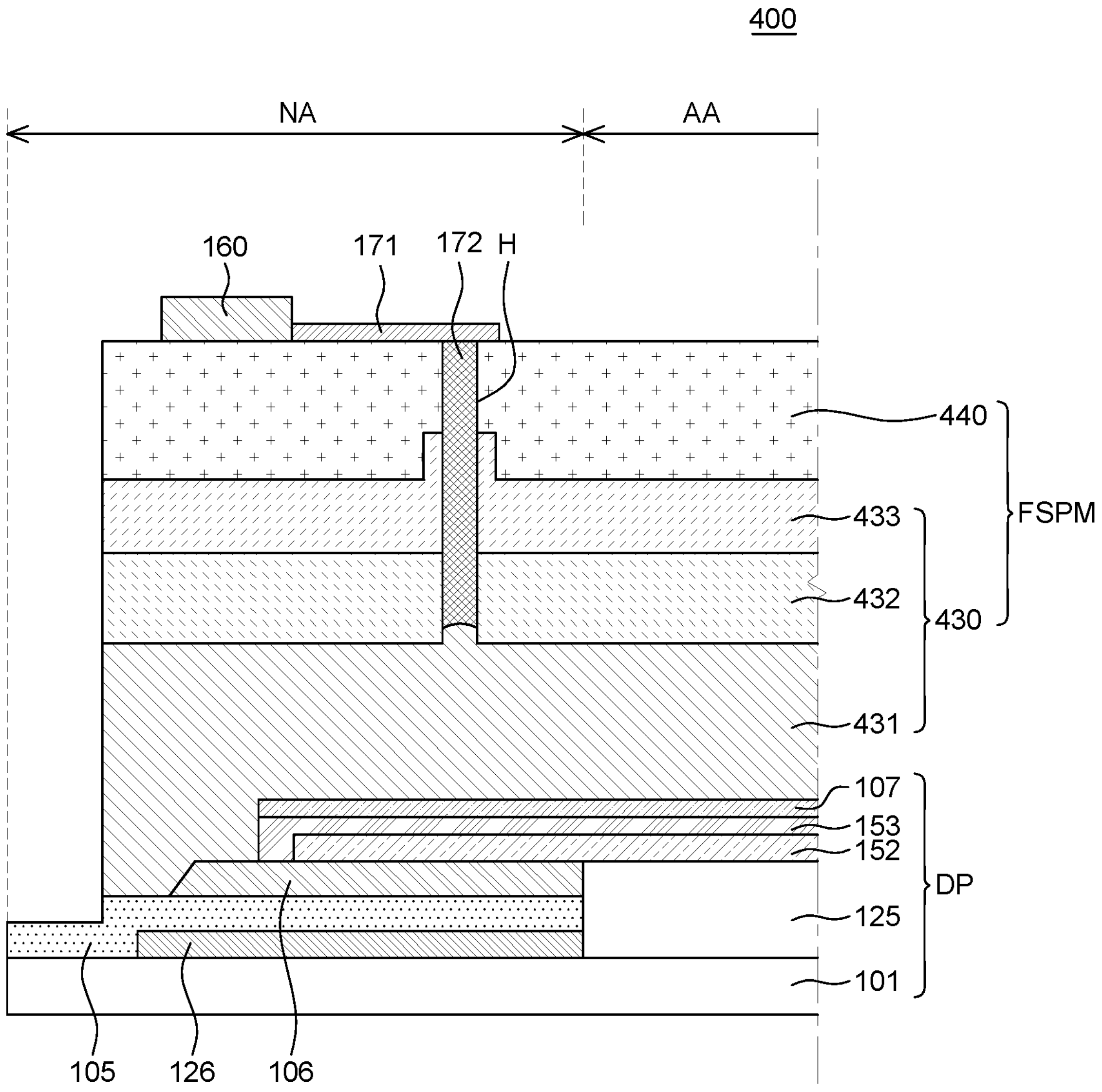
FIG. 11 is a cross-sectional view schematically illustrating an electroluminescent display device according to a fourth exemplary aspect of the present disclosure.

FIG. 11 is a cross-sectional view schematically illustrating an electroluminescent display device according to a fourth exemplary aspect of the present disclosure.

An electroluminescent display device 400 according to the fourth exemplary aspect as shown in FIG. 11 is substantially the same as the electroluminescent display device 100 according to the first exemplary aspect as shown in FIG. 3 except a configuration of a sealing member 430 and a reinforcing substrate 440. Therefore, a repeated description thereof will be omitted.

FIG. 11 shows an example of a cross-sectional view of the upper side of the side portion of the display part DP to which the heat dissipation sheet 160 is attached. For the convenience of description, FIG. 11 schematically illustrates the pixel unit 125 in the active area AA and the GIP unit 126 in the non-active area NA.

Referring to FIG. 11, the encapsulation unit FSPM may be disposed on the display part DP.

The encapsulation unit FSPM may be composed of the sealing member 330 and the reinforcing substrate 440.

The heat dissipation sheet 160 may be disposed on the encapsulation unit FSPM. However, the present disclosure is not limited thereto.

As in the first and second exemplary aspects, the sealing member 430 may include a first adhesive layer 431 facing toward the substrate 101 and a second adhesive layer 433 facing toward the reinforcing substrate 440. Also, the sealing member 430 may include a barrier layer 432 disposed between the first adhesive layer 431 and the second adhesive layer 433.

Further, the hole H may be formed to penetrate a part of the reinforcing substrate 440 and parts of the second adhesive layer 433 and the barrier layer 432 of the sealing member 430.

The hole H may be formed by a punching process.

In the fourth exemplary aspect of the present disclosure, the punching process is performed toward the reinforcing substrate 440 from a lower portion of the barrier layer 432. In this case, a part of a lower end of the reinforcing substrate 440 may be pressed upwards during the punching process so that a space having a greater diameter than the hole H is formed in the reinforcing substrate. The second adhesive layer 433 may fill in the space. However, in this case, the second adhesive layer 433 does not flow down to the barrier layer 432. Thus, it is possible to suppress a decrease in contact area between a side surface of the barrier layer 432 and the conductive paste 172. The shape of the space is not limited to the circular shape, and may include various shapes, as long as the sectional area of the space is larger than that of the hole H.

The conductive paste 172 injected into the hole H may be in contact with the side surface of the barrier layer 432, and the conductive tape 171 is attached onto the conductive paste 172. Thus, the barrier layer 432 of the sealing member 430 may be electrically connected to the conductive tape 171.

The exemplary aspects of the present disclosure may also be described as follows:

According to an aspect of the present disclosure, there is provided an electroluminescent display device. The electroluminescent display device comprises a display part configured to display an image, an encapsulation unit disposed over the display part and a heat dissipation sheet disposed over the encapsulation unit, wherein the encapsulation unit may include a sealing member composed of a first adhesive layer, a second adhesive layer, and a barrier layer between the first adhesive layer and the second adhesive layer, wherein a hole is formed in the second adhesive layer and the barrier layer, and wherein a side surface of the barrier layer may be electrically connected to the heat dissipation sheet through a conductive paste injected into the hole.

A part of the first adhesive layer may be pressed into the hole and protrudes convexly into the hole.

The first adhesive layer and the second adhesive layer may be made of a polymer material having adhesiveness.

The barrier layer may be made of a metal material.

The electroluminescent display device may further include a reinforcing substrate disposed over the sealing member, wherein the hole may be also formed in the reinforcing substrate.

The reinforcing substrate may be made of a plastic polymer material.

The conductive paste may include a silver paste.

The conductive paste may be coated onto a part of an upper surface of the reinforcing substrate.

The electroluminescent display device may further include a conductive tape attached to an upper surface of the encapsulation unit to cover the conductive paste.

A part of a lower end of the reinforcing substrate may be pressed upwards so that a space having a greater diameter than the hole is formed.

The second adhesive layer may fill in the space having the greater diameter than the hole between an inner surface of the reinforcing substrate and the hole.

The display part may include a substrate including an active area and a non-active area, a driving element disposed over the substrate, a planarization layer disposed over the driving element and a light emitting diode disposed over the planarization layer and electrically connected to the driving element.

The hole may be located closer to an active area for displaying the image in the display part than the heat dissipation sheet.

The conductive tape may be located closer to the active area than the heat dissipation sheet.

The hole may be located farther from an active area for displaying the image in the display part than the heat dissipation sheet.

The conductive tape may be located farther from the active area than the heat dissipation sheet.

The hole may be located in an active area for displaying the image in the display part.

The electroluminescent display device may further include a pad and a driving IC disposed over the heat dissipation sheet.

The electroluminescent display device may further include a flexible film attached to a tip end of the display part to cover the pad and the driving IC.

The electroluminescent display device may further include a sealant coated onto a side surface of the display part and a moisture-proof resin coated onto a bonding portion between the display part and the flexible film.

A part of an upper end of the barrier layer may be pressed downwards so that a space having a greater diameter than the hole is formed.

The barrier layer and the conductive paste may be electrically connected to the heat dissipation sheet by the conductive tape.

According to another aspect of the present disclosure, there is provided an electroluminescent display device. The electroluminescent display device comprises a display part configured to display an image, an encapsulation unit disposed over the display part and a dissipator disposed over the encapsulation unit. The encapsulation unit includes a sealing member, the sealing member including a first adhesive layer, a second adhesive layer, and a barrier layer between the first adhesive layer and the second adhesive layer. A hole is formed through the second adhesive layer, and the barrier layer is electrically or thermally connected to the dissipator via a conductive member disposed in the hole.

The hole may be formed at least partly into the barrier layer.

The hole may be formed through the barrier layer.

A surface of the barrier layer inside the hole may be in contact with the conductive member.

The electroluminescent display device may further include a conductive film disposed on the encapsulation unit and arranged to electrically connect the dissipator to the conductive member.

The first and second adhesive layers each may comprise a polymer material having adhesiveness.

The first adhesive layer may include metallic particles, and/or wherein the second adhesive layer includes metallic particles.

The first adhesive layer may include a hygroscopic inorganic filler, optionally wherein the second adhesive layer does not include the hygroscopic inorganic filler.

Either or each of the first and second adhesive layers may have a thickness in the range 10 μm to 100 μm.

The barrier layer may comprise a metal or a metal alloy.

The barrier layer may have a thickness of less than that of each of the first and second adhesive layers, optionally wherein the barrier layer may have a thickness of greater than 10 μm.

The encapsulation unit may comprise a reinforcing substrate.

The reinforcing substrate may be provided over the sealing layer.

The hole may be also formed in the reinforcing substrate.

The conductive member may be disposed on a part of an upper surface of the reinforcing substrate.

The sealing member may have a thickness in the range of 30 μm to 300 μm, and the reinforcing substrate 140 may have a thickness in the range of 0.1 mm to 1.5 mm.

The display part may include an active area comprising pixel units, wherein the hole may be located closer to the active area than the dissipator.

The display part may include an active area comprising pixel units, wherein the hole may be located farther from the active area than the dissipator.

The display part may include an active area comprising pixel units, wherein a conductive film may be located farther from the active area than the dissipator.

The electroluminescent display device may further include a pad and a driving IC disposed on the dissipator.

electroluminescent display device may further include a flexible film attached to an edge of the display part and arranged to cover the pad and the driving IC.

The dissipator may be a heat dissipator and/or an electrical charge dissipator.

It will be apparent to those skilled in the art that various modifications and variations may be made in the display apparatus of the present disclosure without departing from the technical idea or scope of the disclosures. Thus, it is intended that the present disclosure covers the modifications and variations of this disclosure provided they come within the scope of the appended claims and their equivalents.

What is claimed is:

1. An electroluminescent display device, comprising:

a display part configured to display an image;

an encapsulation unit disposed over the display part; and a heat dissipation sheet disposed over the encapsulation unit, wherein the encapsulation unit includes:

a sealing member including a first adhesive layer, a second adhesive layer, a barrier layer disposed between the first adhesive layer and the second adhesive layer, and a hole formed in the second adhesive layer and the barrier layer; and a reinforcing substrate disposed over the sealing member wherein the hole is further formed in the reinforcing substrate, and wherein a side surface of the barrier layer is electrically connected to the heat dissipation sheet through a conductive paste injected into the hole.

2. The electroluminescent display device according to claim 1, wherein a part of the first adhesive layer is pressed into the hole and protrudes convexly into the hole.

3. The electroluminescent display device according to claim 1, wherein the first adhesive layer and the second adhesive layer are made of a polymer material having adhesiveness.

4. The electroluminescent display device according to claim 1, wherein the barrier layer is made of a metal material.

5. The electroluminescent display device according to claim 1, wherein the reinforcing substrate is made of a plastic polymer material.

6. The electroluminescent display device according to claim 1, wherein the conductive paste includes a silver paste.

7. The electroluminescent display device according to claim 1, wherein the conductive paste is coated onto a part of an upper surface of the reinforcing substrate.

8. An electroluminescent display device, comprising:

a display part configured to display an image;

an encapsulation unit disposed over the display part;

a heat dissipation sheet disposed over the encapsulation unit; and a conductive tape attached to an upper surface of the encapsulation unit, wherein the encapsulation unit includes a sealing member including a first adhesive layer, a second adhesive layer, a barrier layer disposed between the first adhesive layer and the second adhesive layer, and a hole formed in the second adhesive layer and the barrier layer, wherein a side surface of the barrier layer is electrically connected to the heat dissipation sheet through a conductive paste injected into the hole, and wherein the conductive tape covers the conductive paste.

9. The electroluminescent display device according to claim 1, wherein a part of a lower end of the reinforcing substrate is pressed upwards so that a space having a greater diameter than the hole is formed.

10. The electroluminescent display device according to claim 9, wherein the second adhesive layer fills in the space having the greater diameter than the hole between an inner surface of the reinforcing substrate and the hole.

11. The electroluminescent display device according to claim 1, wherein the display part includes:

a substrate including an active area and a non-active area;

a driving element disposed over the substrate;

a planarization layer disposed over the driving element; and a light emitting diode disposed over the planarization layer and electrically connected to the driving element.

12. The electroluminescent display device according to claim 8, wherein the hole is located closer to an active area for displaying the image in the display part than the heat dissipation sheet.

13. The electroluminescent display device according to claim 12, wherein the conductive tape is located closer to the active area than the heat dissipation sheet.

14. The electroluminescent display device according to claim 8, wherein the hole is located farther from an active area for displaying the image in the display part than the heat dissipation sheet.

15. The electroluminescent display device according to claim 14, wherein the conductive tape is located farther from the active area than the heat dissipation sheet.

16. The electroluminescent display device according to claim 8, wherein the hole is located in an active area for displaying the image in the display part.

17. The electroluminescent display device according to claim 1, further comprising a pad and a driving IC disposed over the heat dissipation sheet.

18. The electroluminescent display device according to claim 17, further comprising a flexible film attached to a tip end of the display part and covering the pad and the driving IC.

19. The electroluminescent display device according to claim 18, further comprising:

a sealant coated onto a side surface of the display part; and a moisture-proof resin coated onto a bonding portion between the display part and the flexible film.

* * * * *